(12) United States Patent
Kang et al.

(10) Patent No.: US 11,089,700 B2
(45) Date of Patent: Aug. 10, 2021

(54) DISPLAY DEVICE

(71) Applicant: LG Display Co., Ltd., Seoul (KR)

(72) Inventors: ChounSung Kang, Gimpo-si (KR);
Mi-Na Shin, Paju-si (KR); SunBok Song, Gwangmyeong-si (KR); Hoiyong Kwon, Seoul (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/914,802

(22) Filed: Jun. 29, 2020

(65) Prior Publication Data
US 2021/0007230 A1 Jan. 7, 2021

(30) Foreign Application Priority Data

Jul. 4, 2019 (KR) .................. 10-2019-0080718

(51) Int. Cl.
*H05K 5/02* (2006.01)
*H05K 5/03* (2006.01)
*H05K 5/00* (2006.01)
*H05K 1/18* (2006.01)

(52) U.S. Cl.
CPC ............ *H05K 5/0017* (2013.01); *H05K 1/18* (2013.01); *H05K 5/0217* (2013.01); *H05K 5/03* (2013.01); *H05K 2201/10128* (2013.01)

(58) Field of Classification Search
CPC .. H05K 5/0017; H05K 5/0073; H05K 5/0217; H05K 5/0226; H05K 5/0247; H05K 5/03; H05K 1/18; H05K 2201/10128
See application file for complete search history.

(56) References Cited

U.S. PATENT DOCUMENTS

| 7,558,057 | B1* | 7/2009 | Naksen ................. G06F 1/1613 361/679.3 |
| 8,009,422 | B2* | 8/2011 | Misawa ............ G02F 1/133308 361/679.55 |
| 9,992,881 | B2 | 6/2018 | Choi et al. |
| 2011/0132557 | A1* | 6/2011 | Kuroi ..................... G03B 21/58 160/368.1 |
| 2012/0002357 | A1* | 1/2012 | Auld ....................... G09F 21/04 361/679.01 |
| 2014/0247544 | A1* | 9/2014 | Ryu ..................... H05K 5/0226 361/679.01 |

(Continued)

FOREIGN PATENT DOCUMENTS

KR 10-2017-0128662 A 11/2017

*Primary Examiner* — Hoa C Nguyen
(74) *Attorney, Agent, or Firm* — Morgan, Lewis & Bockius LLP

(57) ABSTRACT

A display device includes: a display panel, a back cover which supports the display panel on a rear surface of the display panel; at least one flexible film which is electrically connected to one end of the display panel and is on one surface of the back cover; a printed circuit board which is electrically connected to the at least one flexible film and on one surface of the back cover; and a roller on which the display panel and the back cover are wound or unwound, the roller being configured by a first flat portion, a second flat portion, and a curved portion. When the display panel and the back cover are fully wound around the roller, the at least one flexible film corresponds to the first flat portion, and the printed circuit board corresponds to the second flat portion.

19 Claims, 16 Drawing Sheets

(56) References Cited

U.S. PATENT DOCUMENTS

2016/0231843 A1* 8/2016 Kim .................. G06F 3/0412
2018/0070467 A1* 3/2018 Kim .................. H05K 5/0247
2019/0278335 A1* 9/2019 Yeh .................. G06F 1/1601
2019/0297736 A1* 9/2019 Xu ................... G06F 1/1656

* cited by examiner

DISPLAY DEVICE

CROSS-REFERENCE TO RELATED APPLICATIONS

This application claims the priority of Korean Patent Application No. 10-2019-0080718 filed on Jul. 4, 2019, in the Korean Intellectual Property Office, the disclosure of which is incorporated herein by reference.

BACKGROUND

Technical Field

The present disclosure relates to a display device, and more particularly, to a rollable display device which is capable of displaying images even in a rolled state.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate, such as plastic which is a flexible material so as to be capable of displaying images even though the display device is rolled is getting attention as a next generation display device.

SUMMARY

Accordingly, embodiments of the present disclosure are directed to a display device that substantially obviates one or more of the problems due to limitations and disadvantages of the related art.

An object to be achieved by the present disclosure is to provide a display device which minimizes a damage of a flexible film and a printed circuit board due to repeated winding and unwinding.

Another object to be achieved by the present disclosure is to provide a display device which minimizes a stress applied to a display panel by improving a radius of curvature of a roller around which a display panel is wound.

Still another object to be achieved by the present disclosure is to provide a display device which minimizes separation between a back cover and a display panel when the display device is wound around a roller.

Still another object to be achieved by the present disclosure is to provide a display device which ensures a space where a flexible film and a printed circuit board are disposed by increasing a length of a flat portion of a roller.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises: a display panel, a back cover which supports the display panel on a rear surface of the display panel; at least one flexible film which is electrically connected to one end of the display panel and is disposed on one surface of the back cover; a printed circuit board which is electrically connected to the at least one flexible film and disposed on one surface of the back cover; and a roller on which the display panel and the back cover are wound or unwound, the roller being configured by a first flat portion, a second flat portion, and a curved portion. When the display panel and the back cover are fully wound around the roller, the at least one flexible film is disposed so as to correspond to the first flat portion and the printed circuit board is disposed so as to correspond to the second flat portion. Accordingly, the at least one flexible film and the printed circuit board are wound on a flat portion of the roller to minimize the damage of the at least one flexible film and the printed circuit board.

In another aspect, a display device comprises: a display panel, at least one flexible film which is electrically connected to the display panel; a printed circuit board which is electrically connected to the at least one flexible film; a back cover which supports the display panel, the at least one flexible film, and the printed circuit board and includes a plurality of openings; a first cover unit into which the at least one flexible film, a part of the back cover corresponding to the at least one flexible film, and a part of the display panel corresponding to the at least one flexible film are inserted; a second cover unit into which the printed circuit board and another part of the back cover corresponding to the printed circuit board are inserted; and a roller on which the display panel and the back cover are wound or unwound, the roller including a first flat portion corresponding to the first cover unit and a second flat portion corresponding to the second cover unit and extending from the first flat portion. Accordingly, one end of the display panel is disposed at the inside of the first cover unit to minimize the loosening of one end of the display panel from the back cover when the display panel is wound.

Other detailed matters of the exemplary embodiments are included in the detailed description and the drawings.

According to the present disclosure, even though the display device is wound, the printed circuit board is maintained to be flat so that the damage due to the bending of the printed circuit board may be minimized.

According to the present disclosure, a radius of curvature between a curved portion and a flat portion of a roller is improved to minimize the damage of the display panel due to excessive bending when the display device is wound.

According to the present disclosure, when the display device is wound, an end of a display panel is accommodated in a cover unit so that the end of the display panel is not loosened, thereby minimizing the separation between the display panel and the back cover.

According to the present disclosure, a length of the flat portion of the roller in which the flexible film and the printed circuit board are seated is ensured to the maximum so that a design margin of the flexible film and the printed circuit board may be ensured.

The effects according to the present disclosure are not limited to the contents exemplified above, and more various effects are included in the present specification.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
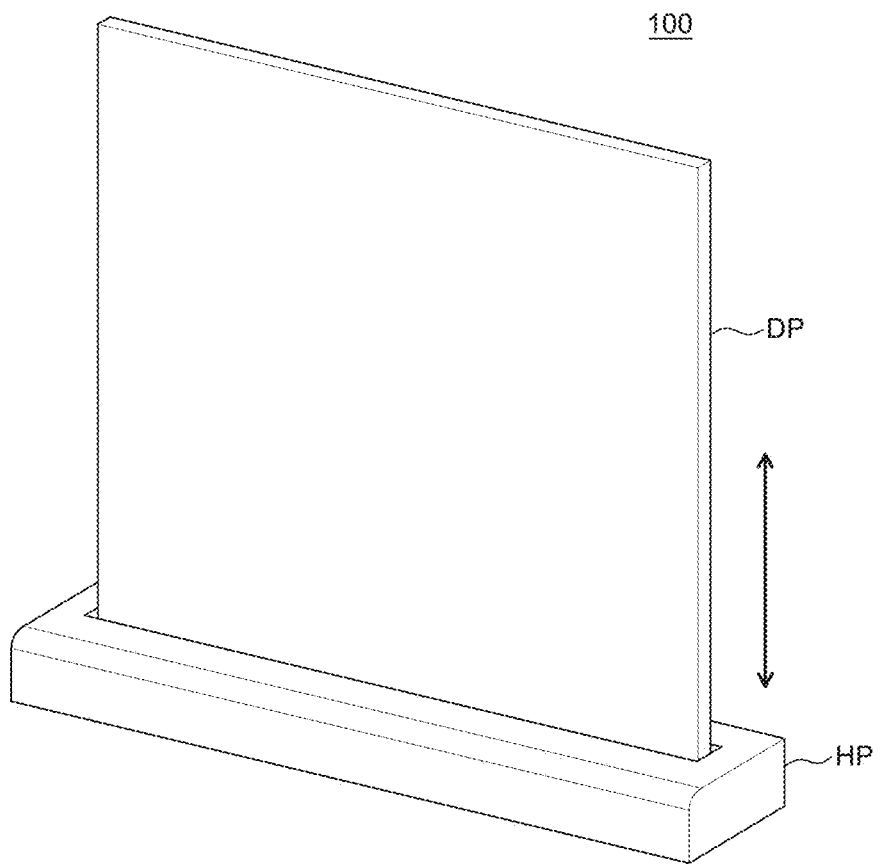
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings <Display Device—Rollable Display Device>

A rollable display device may also be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
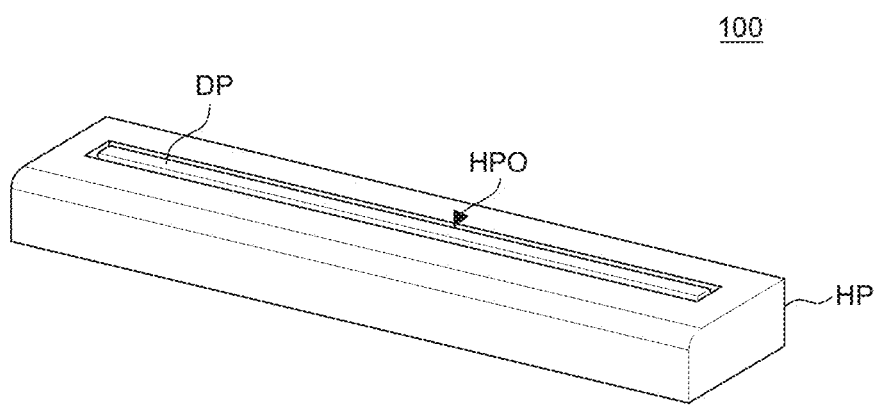

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is a configuration for displaying images to a user. For example, in the display unit DP, a display element and a circuit, a wiring line, and a component for driving the display element may be disposed. In this case, since the display device 100 according to the exemplary embodiment of the present disclosure is a rollable display device, the display unit DP may be configured to be wound or unwound. For example, the display unit DP may be formed of a display panel and a back cover each having flexibility to be wound or unwound. The display unit DP will be described below in more detail with reference to FIGS. 4 to 7.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO so that the display unit DP moves to the inside and the outside of the housing unit HP. The display unit DP may move in a vertical direction by passing through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a driving unit which winds or unwinds the display unit DP is disposed.

<Driving Unit>

Figure 2:
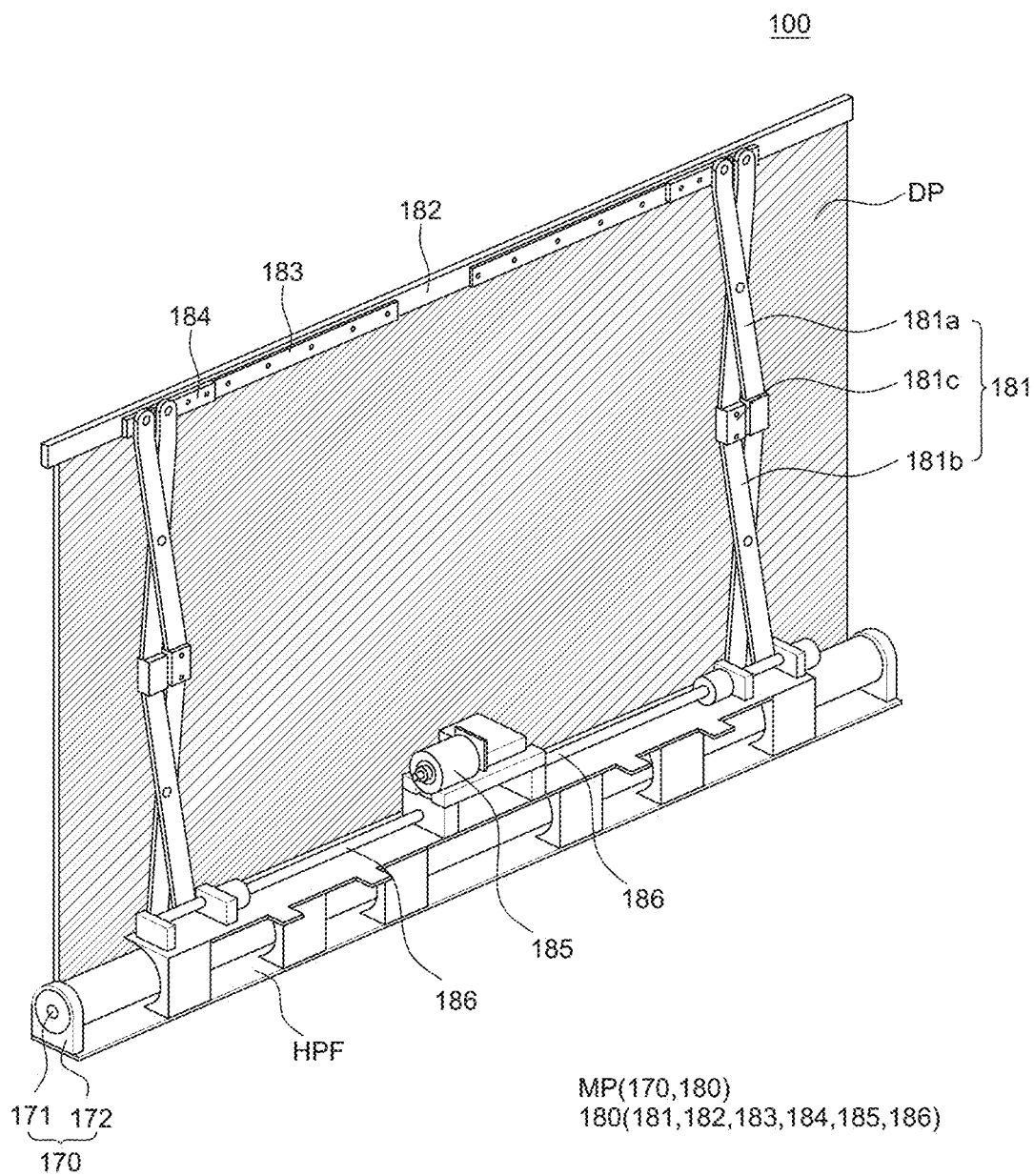
FIG. 2 is a perspective view of a display device according to an exemplary embodiment of the present disclosure.
Figure 3:
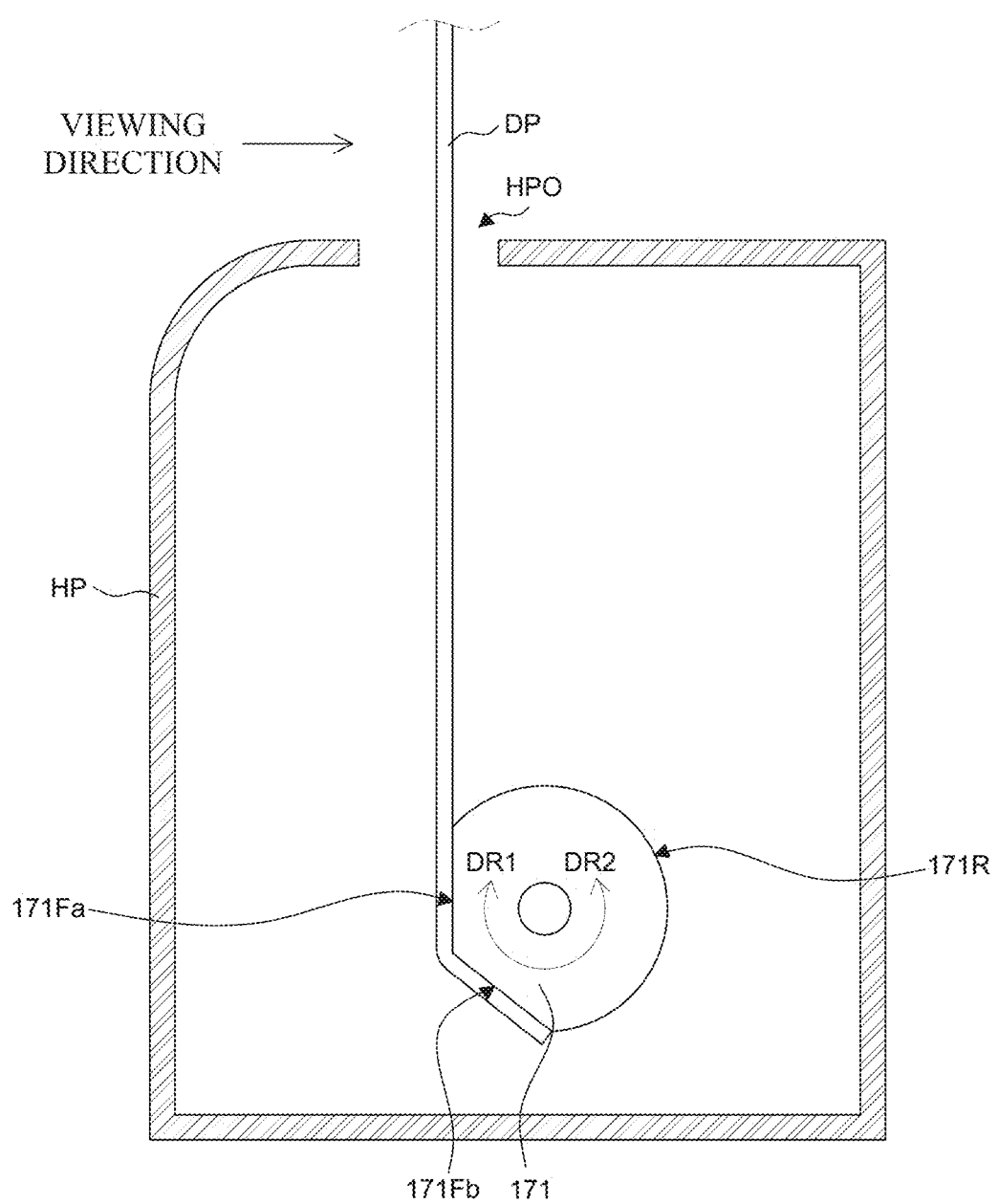
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure. FIG. 3 is a schematic cross-sectional view for explaining a roller 171 and a display unit DP of a display device 100 according to an exemplary embodiment of the present disclosure. For the convenience of description, in FIG. 3, only a housing unit HP, a roller 171, and a display unit DP are illustrated.

First, referring to FIG. 2, a driving unit MP includes a roller unit 170 and a lifting unit 180.

The roller unit 170 rotates in a clockwise direction or a counterclockwise direction and winds or unwinds the display unit DP fixed to the roller unit 170. The roller unit 170 includes a roller 171 and a roller support unit 172.

The roller 171 is a member around which the display unit DP is wound. The roller 171 may be, for example, formed to have a cylindrical shape. A lower edge of the display unit DP may be fixed to the roller 171. When the roller 171 rotates, the display unit DP which is fixed to the roller 171 through the lower edge may be wound around the roller 171. In contrast, when the roller 171 rotates in an opposite direction, the display unit DP which is wound around the roller 171 may be unwound from the roller 171.

Referring to FIG. 3, the roller 171 may be formed to have a cylindrical shape in which at least a part of an outer circumferential surface of the roller 171 is flat and the remaining part of the outer circumferential surface is a curved surface. Even though the roller 171 may be entirely a cylindrical shape, but some parts may be formed of a flat surface. That is, a part of the outer circumferential surface of the roller 171 is formed to be flat and the remaining part of the outer circumferential surface is formed to be a curved surface. For example, the roller 171 is configured by a curved portion 171R, a first flat portion 171Fa, and a second flat portion 171Fb. In the first flat portion 171Fa and the second flat portion 171Fb of the roller 171, at least one flexible film and the printed circuit board of the display unit DP may be seated. However, the roller 171 may have a completely cylindrical shape or an arbitrary shape which may wind the display unit DP but is not limited thereto. A winding process of the roller 171 configured by the curved portion 171R, the first flat portion 171Fa, and the second flat portion 171Fb and the display unit DP will be described below with reference to FIGS. 8A to 8D.

Referring to FIG. 2 again, the roller support unit 172 supports the roller 171 at both sides of the roller 171. Specifically, the roller support unit 172 is disposed on a bottom surface HPF of the housing unit HP. Upper side surfaces of the roller support unit 172 are coupled to both ends of the roller 171. Therefore, the roller support unit 172 may support the roller 171 to be spaced apart from the bottom surface HPF of the housing unit HP. In this case, the roller 171 may be rotatably coupled to the roller support unit 172.

The lifting unit 180 moves the display unit DP in a vertical direction in accordance with the driving of the roller unit 170. The lifting unit 180 includes a link unit 181, a head bar 182, a slide rail 183, a slider 184, a motor 185, and a rotary unit 186.

The link unit 181 of the lifting unit 180 includes a plurality of links 181a and 181b and a hinge unit 181c which connects the plurality of links 181a and 181b to each other. Specifically, the plurality of links 181a and 181b includes a first link 181a and a second link 181b and the first link 181a and the second link 181b cross each other in the form of scissors to be rotatably fastened by means of the hinge unit 181c. When the link unit 181 moves in the vertical direction, the plurality of links 181a and 181b rotates to be far away from each other or close to each other.

The head bar 182 of the lifting unit 180 is fixed to an uppermost end of the display unit DP. The head bar 182 is coupled to the link unit 181 to move the display unit DP in the vertical direction in accordance with the rotation of the plurality of links 181a and 181b of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on the front surface of the display unit DP. The display unit DP and the head bar 182 may be fixed by a screw, but are not limited thereto.

The slide rail 183 of the lifting unit 180 provides a movement path of the plurality of links 181a and 181b. Some of the plurality of links 181a and 181b is rotatably fastened with the slide rail 183 so that the motion is guided along a trajectory of the slide rail 183. Some of the plurality of links 181a and 181b is fastened with the slider 184 which is movably provided along the slide rail 183 to move along a trajectory of the slide rail 183.

The motor 185 is connected to a power generating unit, such as a separate external power source or a built-in battery, to be supplied with the power. The motor 185 generates a torque to provide a driving force to the rotary unit 186.

The rotary unit 186 is connected to the motor 185 to be configured to convert a rotational motion from the motor 185 into a linear reciprocating motion. That is, the rotational motion of the motor 185 may be converted into the linear reciprocating motion of a structure fixed to the rotary unit 186. For example, the rotary unit 186 may be implemented by a shaft and a ball screw including a nut which is fastened with the shaft but is not limited thereto.

The motor 185 and the rotary unit 186 interwork with the link unit 181 to lift the display unit DP. The link unit 181 is formed with a link structure to receive the driving force from the motor 185 and the rotary unit 186 to repeatedly perform a folding or unfolding operation.

Specifically, when the display unit DP is wound, the motor 185 is driven so that the structure of the rotary unit 186 may perform linear motion. That is, a part of the rotary unit 186 to which one end of the second link 181b is coupled may perform the linear motion. Therefore, one end of the second link 181b moves to the motor 185 and the plurality of links 181a and 181b is folded so that the height of the link unit 181 may be lowered. Further, while the plurality of links 181a and 181b is folded, the head bar 182 coupled to the first link 181a is also lowered and one end of the display unit DP coupled to the head bar 182 is also lowered.

When the display unit DP is unwound, the motor 185 is driven so that the structure of the rotary unit 186 may perform linear motion. That is, a part of the rotary unit 186 to which one end of the second link 181b is coupled may perform the linear motion. Therefore, one end of the second link 181b moves to be away from the motor 185, and the plurality of links 181a and 181b is unfolded so that the height of the link unit 181 may be increased. Further, when the plurality of links 181a and 181b is unfolded, the head bar 182 coupled to the first link 181a is also lifted and one end of the display unit DP coupled to the head bar 182 is also lifted.

When the display unit DP is fully wound around the roller 171, the link unit 181 of the lifting unit 180 maintains a folded state. That is, when the display unit DP is fully wound around the roller 171, the lifting unit 180 may have a smallest height. When the display unit DP is fully unwound, the link unit 181 of the lifting unit 180 maintains an unfolded state. That is, when the display unit DP is fully unwound, the lifting unit 180 may have a largest height.

In the meantime, when the display unit DP is wound, the roller 171 may rotate and the display unit DP may be wound around the roller 171. For example, referring to FIG. 3 together, a lower edge of the display unit DP is coupled to the roller 171. When the roller 171 rotates in a second direction DR2, that is, a counterclockwise direction, the display unit DP may be wound while a bottom surface of the display unit DP is in close contact with the surface of the roller 171.

When the display unit DP is unwound, the roller 171 may rotate and the display unit DP may be unwound from the roller 171. For example, referring to FIG. 3, when the roller 171 rotates in a first direction DR1, that is, in a clockwise direction, the display unit DP which is wound around the roller 171 is unwound from the roller 171 to be disposed at the outside of the housing unit HP.

In some exemplary embodiments, a driving unit MP having another structure other than the above-described driving unit MP may be applied to the display device 100. That is, as long as the display unit DP is wound and unwound, the above-described configuration of the roller unit 170 and the lifting unit 180 may be modified, some configurations may be omitted, or another configuration may be added.

<Display Unit>

Figure 4:
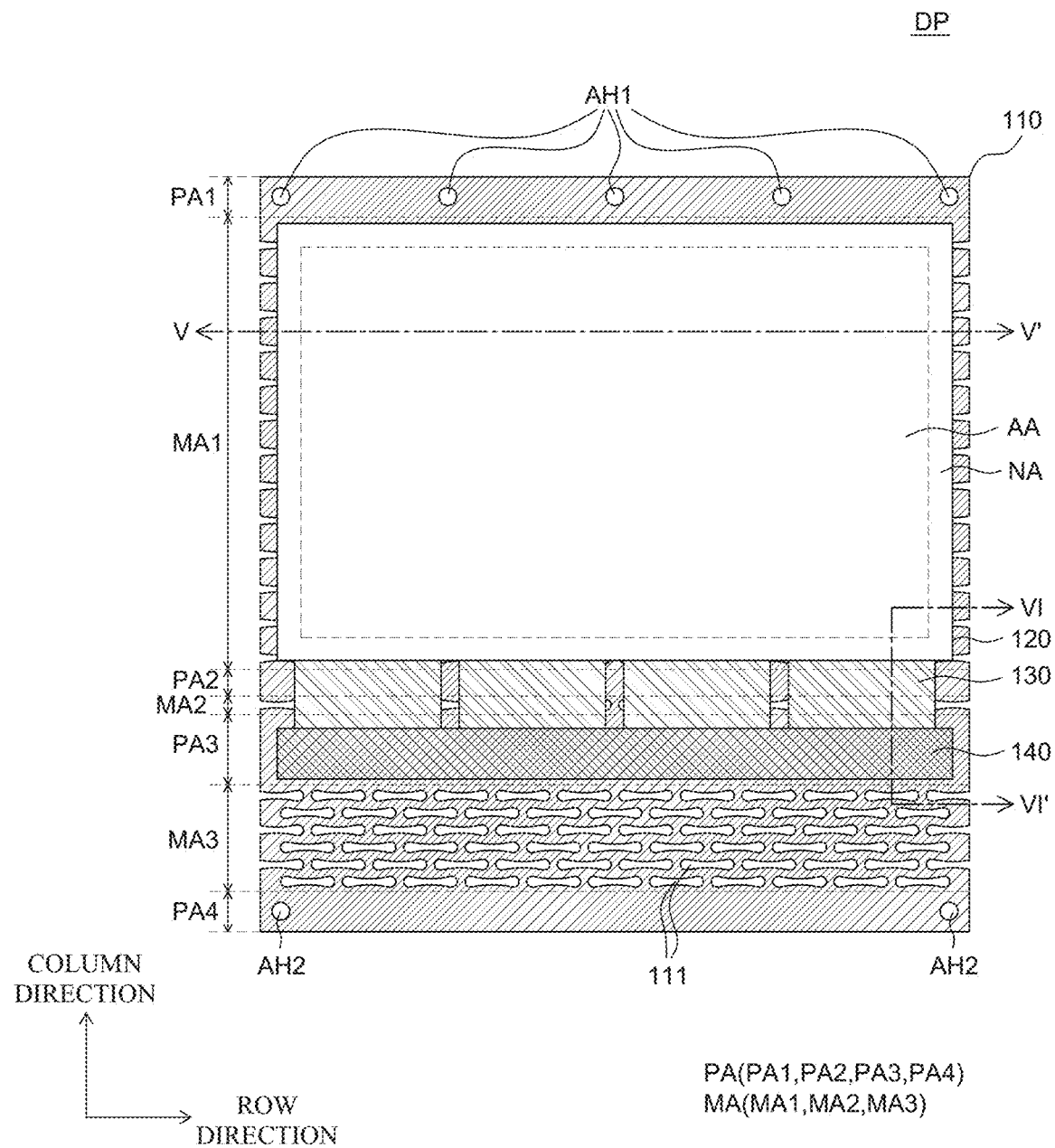
FIG. 4 is a plan view of a display unit of a display device according to an exemplary embodiment of the present disclosure.
Figure 5:
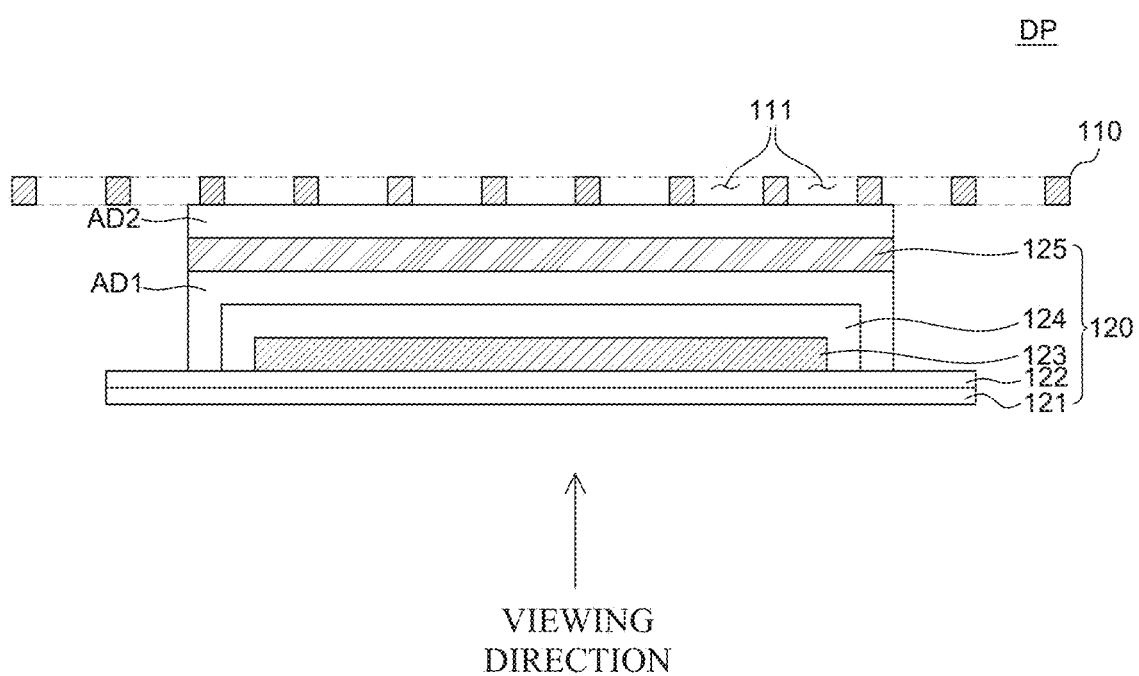
FIG. 5 is a cross-sectional view taken along the line V-V' of FIG. 4.
Figure 6:
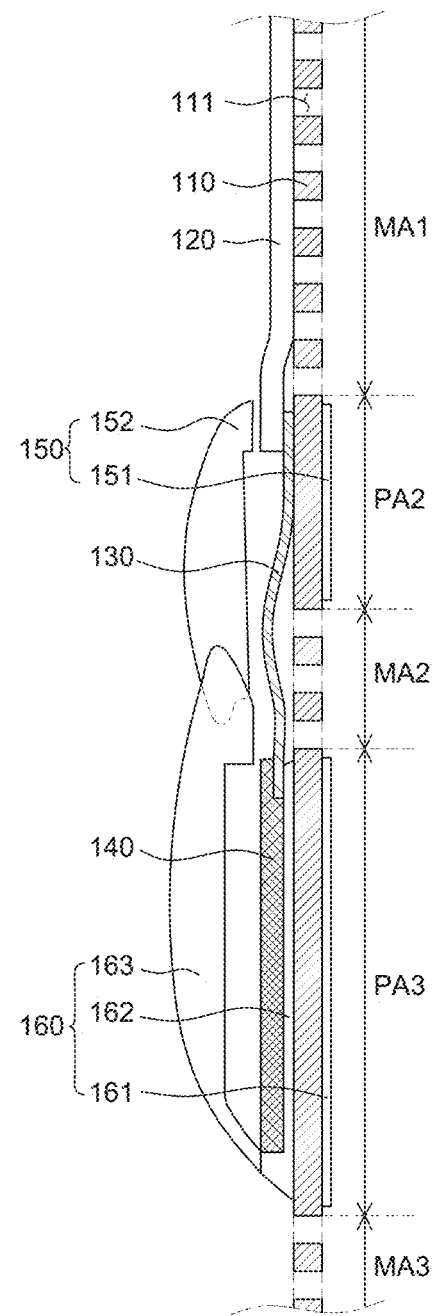
FIG. 6 is a cross-sectional view taken along the line VI-VI' of FIG. 4.
Figure 7:
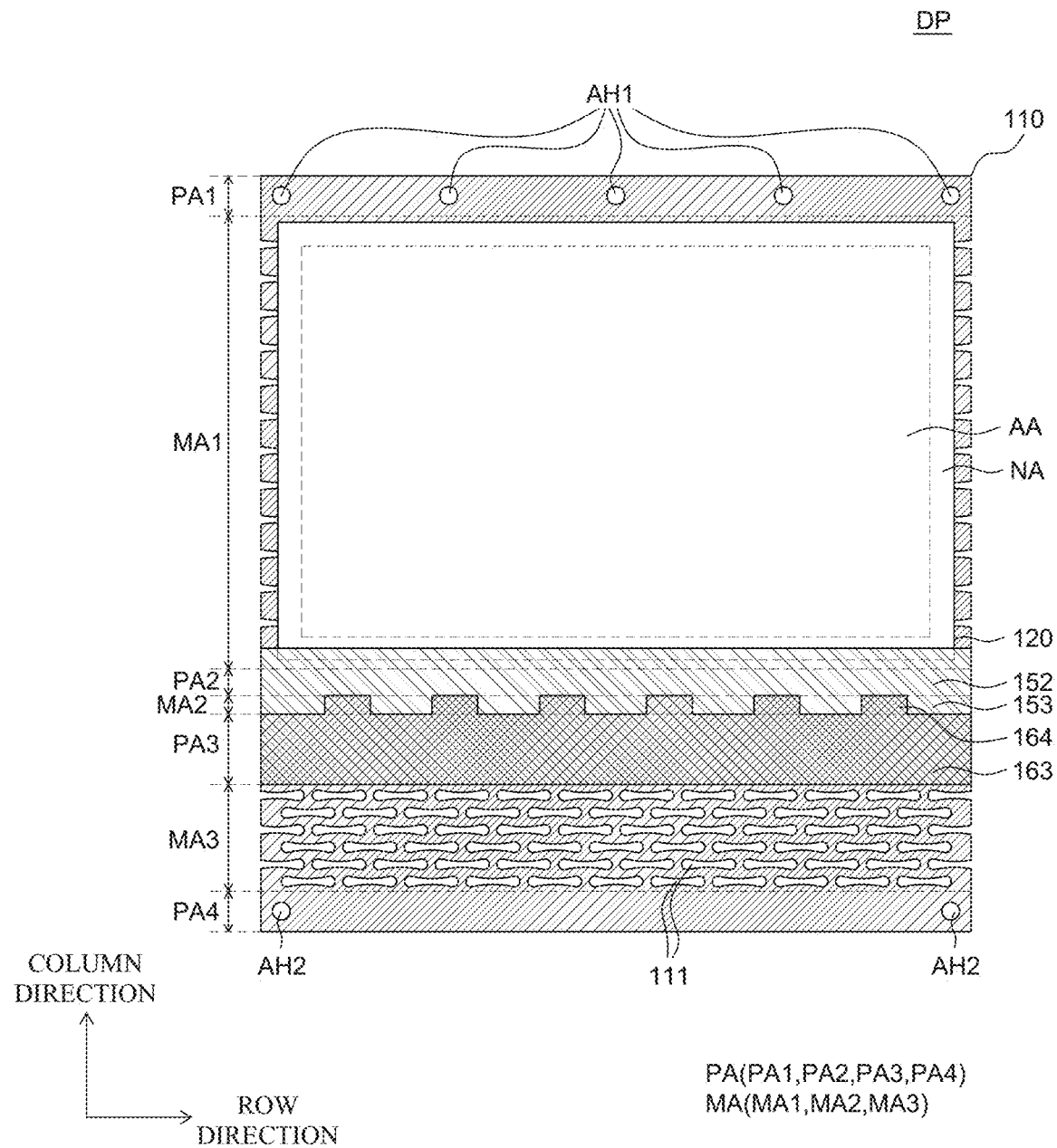
FIG. 7 is a plan view of a display unit of a display device according to an exemplary embodiment of the present disclosure.

FIG. 4 is a plan view of a display unit of a display device according to an exemplary embodiment of the present disclosure. FIG. 5 is a cross-sectional view taken along the line V-V' of FIG. 4. FIG. 6 is a cross-sectional view taken along the line VI-VI' of FIG. 4. FIG. 7 is a plan view of a display unit of a display device according to an exemplary embodiment of the present disclosure. Referring to FIGS. 4 to 7, the display unit DP includes a back cover 110, a display panel 120, at least one flexible film 130, a printed circuit board 140, a first cover unit 150, and a second cover unit 160. In FIG. 4, for the convenience of description, the first cover unit 150 and the second cover unit 160 are not illustrated.

Referring to FIG. 4, the back cover 110 is disposed on a rear surface of the display panel 120 to support the display panel 120, the at least one flexible film 130, and the printed circuit board 140. A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar, or plastic. However, if the material of the back cover 110 satisfies physical conditions such as a thermal strain amount, a radius of curvature, and a rigidity, the material may be diversely changed depending on the design and is not limited thereto.

The back cover 110 includes a plurality of support areas PA and a plurality of malleable areas MA. The plurality of support areas PA is areas where a plurality of openings 111 is not disposed and the plurality of malleable areas MA is areas where a plurality of openings 111 is disposed. Specifically, a first support area PA1, a first malleable area MA1, a second support area PA2, a second malleable area MA2, a third support area PA3, a third malleable area MA3, and a fourth support area PA4 are sequentially disposed from the uppermost end of the back cover 110. In this case, since the back cover 110 is wound or unwound in a column direction, the plurality of support areas PA and the plurality of malleable areas MA may be disposed along the column direction.

The first support area PA1 is an uppermost area of the back cover 110 and is fastened with the head bar 182. The first support area PA1 includes first fastening holes AH1 to be fastened with the head bar 182. For example, screws which pass through the head bar 182 and the first fastening holes AH1 are disposed so that the head bar 182 is fastened with the first support area PA1 of the back cover 110. As the first support area PA1 is fastened with the head bar 182, when the link unit 181 which is fastened with the head bar 182 is lifted or lowered, the back cover 110 may be also lifted and lowered together with the display panel 120 attached to the back cover 110. Even though five first fastening holes AH1 are illustrated in FIG. 4, the number of first fastening holes AH1 is not limited thereto. Further, even though it is described that the back cover 110 is fastened with the head bar 182 using the first fastening holes AH1 in FIG. 4, it is not limited thereto and the back cover 110 and the head bar 182 may be fastened with each other without using a separate fastening hole.

The first malleable area MA1 is an area extending from the first support area PA1 to a lower side of the back cover 110. The first malleable area MA1 is an area in which a plurality of openings 111 is disposed and the display panel 120 is attached. Specifically, the first malleable area MA1 is an area which is wound around or unwound from the roller 171 together with the display panel 120. The first malleable area MA1 may overlap at least the display panel 120 among other configurations of the display unit DP.

The second support area PA2 extends from the first malleable area MA1 to the lower side of the back cover 110. The at least one flexible film 130 which is coupled to one end of the display panel 120 may be disposed in the second support area PA2.

The third support area PA3 is an area extending from the second malleable area MA2 to the lower side of the back cover 110. The printed circuit board 140 may be disposed in the third support area PA3.

In order to protect the at least one flexible film 130 and the printed circuit board 140, the second support area PA2 and the third support area PA3 may support the at least one flexible film 130 and the printed circuit board 140 to be maintained to be flat without being bent in the roller 171.

When the second support area PA2 and the third support area PA3 are wound around the roller 171, a part of the outer circumferential surface of the roller 171 which is in contact with the second support area PA2 and the third support area PA3 may be formed to be flat. Accordingly, the second support area PA2 and the third support area PA3 may be maintained to be flat regardless of being wound around or unwound from the roller 171 and the at least one flexible film 130 and the printed circuit board 140 disposed in the second support area PA2 and the third support area PA3 may also be maintained to be flat.

The second malleable area MA2 is disposed between the second support area PA2 and the third support area PA3. A plurality of openings 111 is disposed in the second malleable area MA2 and the second malleable area MA2 is disposed between the second support area PA2 and the third support area PA3 so that the second support area PA2 and the third support area PA3 are wound on different flat portions of the outer circumferential surface of the roller 171.

The third malleable area MA3 is an area extending from the third support area PA3 to the lower side of the back cover 110. In the third malleable area MA3, a plurality of openings 111 is disposed and the third malleable area MA3 extends to dispose a display area AA of the display panel 120 at the outside of the housing unit HP. For example, when the back cover 110 and the display panel 120 are fully unwound, an area from the fourth support area PA4 of the back cover 110 which is fixed to the roller 171 to the second support area PA2 in which the at least one flexible film 130 is disposed may be disposed in the housing unit HP. The first malleable area MA1 which the display panel 120 is attached and the first support area PA1 may be disposed at the outside of the housing unit HP. That is, the fourth support area PA4 fixed to the roller 171, the third malleable area MA3, the third support area PA3, the second malleable area MA2, and the second support area PA2 extending from the fourth support area PA4 may be disposed in the housing unit HP.

In this case, when a length from the fourth support area PA4 fixed to the roller 171 to the second support area PA2 is smaller than a length from the fourth support area PA4 to the opening HPO of the housing unit HP, a part of the first malleable area MA1 to which the display panel 120 is attached may be disposed in the housing unit HP. Further, since a part of the lower end of the display area AA of the display panel 120 is disposed in the housing unit HP, it may be difficult to watch images. Therefore, the length from the fourth support area PA4 fixed to the roller 171 to the third malleable area MA3, the third support area PA3, the second malleable area MA2, and the second support area PA2 may be designed to be equal to the length from the fourth support area PA4 fixed to the roller 171 to the opening HPO of the housing unit HP.

The fourth support area PA4 is an area extending from the third malleable area MA3 to the lower side of the back cover 110. The fourth support area PA4 is a lowermost area of the back cover 110 and is fastened with the roller 171. The fourth support area PA4 may include second fastening holes AH2 to be fastened with the roller 171. For example, screws which pass through the roller 171 and the second fastening holes AH2 are disposed to fasten the roller 171 and the fourth support area PA4 of the back cover 110 with each other. As the fourth support area PA4 is fastened with the roller 171, the back cover 110 may be wound around or unwound from the roller 171. Even though two second fastening holes AH2 are illustrated in FIG. 4, the number of second fastening holes AH2 is not limited thereto.

In the meantime, in the first support area PA1, the second support area PA2, the third support area PA3, and the fourth support area PA4, the plurality of openings 111 as formed in the plurality of malleable areas MA is not formed. Specifically, the first fastening holes AH1 are formed in the first support area PA1 and the second fastening holes AH2 are formed in the fourth support area PA4, but the plurality of openings 111 as formed in the plurality of malleable areas MA is not formed in the first support area PA1, the second support area PA2, the third support area PA3, and the fourth support area PA4. Further, the first fastening holes AH1 and the second fastening holes AH2 have different shapes from that of the plurality of openings 111. The first support area PA1 is an area fixed to the head bar 182, the second support area PA2 is an area where the at least one flexible film 130 is supported, the third support area PA3 is an area where the printed circuit board 140 is supported, and the fourth support area PA4 is an area fixed to the roller 171. Therefore, the plurality of support areas PA may have a rigidity larger than that of the plurality of malleable areas MA.

Specifically, as the first support area PA1, the second support area PA2, the third support area PA3, and the fourth support area PA4 have the rigidity, the first support area PA1 and the fourth support area PA4 may be firmly fixed to the head bar 182 and the roller 171, respectively. The second support area PA2 and the third support area PA3 maintain the at least one flexible film 130 and the printed circuit board 140 to be flat so as not to be bent, thereby protecting the at least one flexible film 130 and the printed circuit board 140. Therefore, the display unit DP is fixed to the roller 171 and the head bar 182 of the driving unit MP to move to the inside or the outside of the housing unit HP according to the operation of the driving unit MP and protect the at least one flexible film 130 and the printed circuit board 140.

In the meantime, in FIG. 4, even though it is illustrated that the plurality of support areas PA and the plurality of malleable areas MA of back cover 110 are sequentially disposed along the column direction, when the back cover 110 is wound in the row direction, the plurality of support areas PA and the plurality of malleable areas MA may be disposed along a row direction.

When the display unit DP is wound or unwound, the plurality of openings 111 disposed in the plurality of malleable areas MA of the back cover 110 may be deformed by a stress which is applied to the display unit DP. Specifically, when the display unit DP is wound or unwound, the plurality of malleable areas MA of the back cover 110 may be deformed as the plurality of openings 111 contracts or expands. Further, as the plurality of openings 111 contracts or expands, a slip phenomenon of the display panel 120 disposed on the plurality of malleable areas MA of the back cover 110 is minimized so that the stress which is applied to the display panel 120 may be minimized.

When the display panel 120 and the back cover 110 are wound, a difference between a length of the display panel 120 which is wound around the roller 171 and a length of the back cover 110 which is wound around the roller 171 may be caused due to the difference of radii of curvature of the display panel 120 and the back cover 110. For example, when the back cover 110 and the display panel 120 are wound around the roller 171, a length of the back cover 110 required for being wound around the roller 171 once may be different from a length of the display panel 120 required for being wound around the roller 171 once. That is, since the display panel 120 is disposed outer than the back cover 110 with respect to the roller 171, a length of the display panel 120 required for being wound around the roller 171 once may be larger than a length of the back cover 110 required for being wound around the roller 171 once. As described above, the winding lengths of the back cover 110 and the display panel 120 are different from each other due to the difference of radii of curvature at the time of winding the display unit DP so that the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In the display device 100 according to an exemplary embodiment of the present disclosure, even though the display unit DP is wound or unwound and a stress is applied to the display unit DP, the plurality of openings 111 of the back cover 110 is flexibly deformed to relieve the stress applied to the back cover 110 and the display panel 120. For example, when the back cover 110 and the display panel 120 are wound around the roller 171 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, the plurality of openings 111 is deformed during the process of winding the back cover 110 and the display panel 120 so that a stress which is applied to the display panel 120 from the back cover 110 may also be relieved.

Referring to FIG. 4, the display panel 120 is disposed on one surface of the back cover 110. The display panel 120 is disposed in the first malleable area MA1, on one surface of the back cover 110. The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device, the display panel 120 may be implemented as a flexible display panel to be wound around or unwound from the roller 171.

Referring to FIG. 4, the display panel 120 includes a display area AA and a non-display area NA.

The display area AA is an area where images are displayed in the display panel 120. In the display area AA, a plurality of sub pixels and a driving circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element and a wiring line. For example, the driving circuit may be configured by a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and driving circuits of the display area AA or a driving IC such as a gate driver IC or a data driver IC may be disposed, but is not limited thereto.

Referring to FIG. 5, the display panel 120 includes a substrate 121, a buffer layer 122, a pixel unit 123, an encapsulating layer 124, and an encapsulating substrate 125.

The substrate 121 which is a base member for supporting various components of the display panel 120 may be configured by an insulating material. The substrate 121 may be formed of a material having flexibility so that the display panel 120 is wound or unwound. For example, the substrate 121 may be formed of a plastic material such as polyimide PI.

The buffer layer 122 is disposed on a top surface of the substrate 121. The buffer layer 122 may suppress moisture and/or oxygen which is permeated from the outside of the substrate 121 from being spread. The buffer layer 122 may be formed of an inorganic material, for example, may be configured by a single layer or a double layer of silicon oxide SiOx and silicon nitride SiNx, but is not limited thereto.

The pixel unit 123 is disposed on the top surface of the substrate 121 and the buffer layer 122. The pixel unit 123 includes a plurality of organic light emitting diodes and a circuit for driving the plurality of organic light emitting diodes. The pixel unit 123 may be disposed so as to correspond to the display area AA.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectance.

Hereinafter, for the convenience of description, the description will be made by assuming that the display device 100 according to an exemplary embodiment of the present disclosure is a bottom emission type display device but it is not limited thereto.

The encapsulating layer 124 is disposed to cover the pixel unit 123. The encapsulating layer 124 closely seals the organic light emitting diode of the pixel unit 123. The encapsulating layer 124 may protect the organic light emitting diode of the pixel unit 123 from moisture, oxygen, and impacts of the outside. The encapsulating layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulating substrate 125 is disposed on the encapsulating layer 124. Specifically, the encapsulating substrate 125 is disposed between the encapsulating layer 124 and the back cover 110. The encapsulating substrate 125 may protect the organic light emitting diode of the pixel unit 123 together with the encapsulating layer 124. The encapsulating substrate 125 may protect the organic light emitting diode of the pixel unit 123 from moisture, oxygen, and impacts of the outside. For example, the encapsulating substrate 125 may be formed of a material having a high modulus of approximately 200 to 900 MPa. The encapsulating substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulating substrate 125 is formed of a metal material, the encapsulating substrate 125 may be implemented as an ultra-thin film and provide a strong resistance against external impacts and scratches.

A first adhesive layer AD1 is disposed between the encapsulating layer 124 and the encapsulating substrate 125. The first adhesive layer AD1 may bond the encapsulating layer 124 and the encapsulating substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA) but is not limited thereto.

In the meantime, the first adhesive layer AD1 may be disposed to enclose the encapsulating layer 124 and the pixel unit 123. That is, the pixel unit 123 may be sealed by the buffer layer 122 and the encapsulating layer 124. The encapsulating layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulating layer 124 and the encapsulating substrate 125. In this case, the first adhesive layer AD1 may further include an absorbent. The absorbent may be particles having hygroscopicity and absorb moisture and oxygen from the outside to minimize permeation of the moisture and oxygen into the pixel unit 123.

A second adhesive layer AD2 is disposed between the encapsulating substrate 125 and the back cover 110. The second adhesive layer AD2 may bond the encapsulating substrate 125 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA) but is not limited thereto.

Even though in FIG. 5, it is illustrated that the plurality of openings 111 of the back cover 110 is not filled with the second adhesive layer AD2, the second adhesive layer AD2 may be filled in some or all of the plurality of openings 111. If the second adhesive layer AD2 is filled inside the plurality of openings 111 of the back cover 110, a contact area between the second adhesive layer AD2 and the back cover 110 is increased so that a separation phenomenon between the second adhesive layer AD2 and the back cover 110 may be avoided.

Even though not illustrated in the drawing, a polarizing plate is disposed on a rear surface of the display panel 120. The polarizing plate selectively transmits light to reduce the reflection of external light which is incident onto the display panel 120. Specifically, the display panel 120 includes various metal materials applied to the semiconductor element, the wiring line, and the organic light emitting diode. Therefore, the external light incident onto the display panel 120 may be reflected from the metal material so that the visibility of the display device 100 may be reduced due to the reflection of the external light. Therefore, when the polarizing plate is disposed, the polarizing plate suppresses the reflection of the external light to increase the outdoor visibility of the display device 100. However, the polarizing plate may be omitted depending on an implementation example of the display device 100.

Referring to FIG. 4, at least one flexible film 130 is disposed in the second support area PA2 of the back cover 110. The at least one flexible film 130 is films in which various components are disposed on a base film having a malleability and supplies a signal to the plurality of sub pixels and the driving circuits which configure the plurality of pixels in the display area AA and is electrically connected to the display panel 120. One ends of the at least one flexible film 130 are disposed in the non-display area NA of the display panel 120 to supply a power voltage or a data voltage to the plurality of sub pixels and the driving circuits of the display area AA. Even though the at least one flexible film 130 is four in FIG. 4, the number of flexible films 130 may vary depending on the design and is not limited thereto.

In the meantime, a driving IC such as a gate driver IC or a data driver IC may be disposed on the at least one flexible film 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the at least one flexible film 130 by a chip on film technique, but is not limited thereto.

The printed circuit board 140 is disposed in the third support area PA3 of the back cover 110 to be coupled to the at least one flexible film 130. The printed circuit board 140 is a component which supplies signals to the driving IC. Various components may be disposed in the printed circuit board 140 to supply various signals such as a driving signal or a data signal to the driving IC. In the meantime, even though one printed circuit board 140 is illustrated in FIG. 4, the number of printed circuit boards 140 may vary depending on the design and is not limited thereto.

Even though not illustrated in FIG. 4, an additional printed circuit board 140 which is electrically connected to the printed circuit board 140 may be further disposed. For example, the printed circuit board 140 may be referred to as a source printed circuit board S-PCB on which the data driver is mounted and the additional printed circuit board connected to the printed circuit board 140 may be referred to as a control printed circuit board C-PCB in which the timing controller is mounted. The additional printed circuit board may be disposed in the roller 171 or disposed in the housing unit HP at the outside of the roller 171, or disposed to be in direct contact with the printed circuit board 140.

Referring to FIGS. 6 and 7, the first cover unit 150 is disposed in the second support area PA2 of the back cover 110 to accommodate the at least one flexible film 130. The at least one flexible film 130, a part of the back cover 110 corresponding to the at least one flexible film 130, and an end of the display panel 120 coupled to the at least one flexible film 130 may be inserted into the first cover unit 150. The first cover unit 150 is disposed to cover the at least one flexible film 130 to protect the at least one flexible film 130. The first cover unit 150 is disposed so as to cover one end of the display panel 120 to fix one end of the display panel 120 so as not to be loosened from the back cover 110. The first cover unit 150 is disposed so as to cover one end of the display panel 120 so as to minimize the separation of the display panel 120 and the back cover 110 due to the repeated winding and unwinding of the display unit DP.

The first cover unit 150 includes a first base plate 151, a first cover plate 152, and a plurality of first protrusions 153.

Referring to FIG. 6, the first base plate 151 is disposed on an opposite surface of one surface of the back cover 110. The first base plate 151 may be fixed to the second support area PA2 on the opposite surface of one surface of the back cover 110 on which the display panel 120 is not disposed. The first base plate 151 and the at least one flexible film 130 may be disposed so as to correspond to each other with the back cover 110 therebetween. The first base plate 151 may support the at least one flexible film 130 together with the second support area PA2. For example, the first base plate 151 is formed of a material having a rigidity to support the second support area PA2 to be flat but is not limited thereto.

The first cover plate 152 is disposed on one surface of the back cover 110. The first cover plate 152 is disposed so as to cover the at least one flexible film 130 and one end of the display panel 120 disposed on the second support area PA2 of the back cover 110 and may be formed to have a convex shape. That is, one surface of the first cover plate 152 may be formed as a curved surface. The first cover plate 152 may be fixed to the second support area PA2 and the first base plate 151 on one surface of the back cover 110 on which the display panel 120 and the at least one flexible film 130 are disposed. The first cover plate 152 is formed of a material having a rigidity to protect one end of the display panel 120 and the at least one flexible film 130 but is not limited thereto.

Referring to FIG. 7 together, the plurality of first protrusions 153 which protrudes from the first cover plate 152 toward the second cover plate 163 and is spaced apart from each other is disposed. The plurality of first protrusions 153 extends from the first cover plate 152 toward the second cover plate 163 to be disposed in the second malleable area MA2.

In the meantime, the first cover unit 150 and the back cover 110 may be fixed to each other. For example, a plurality of fixing holes is formed in the second support area PA2 and the first cover unit 150 and the back cover 110 may be fixed such that the protrusion protruding from the first base plate 151 is inserted into the fixing holes. For example, the first cover unit 150 and the back cover 110 may be fixed to each other by a member such as a screw which passes through the first base plate 151, the first cover plate 152, and the back cover 110. In this case, the member such as a screw may be disposed so as not to interfere with the at least one flexible film 130 and one end of the display panel 120 so that the at least one flexible film 130 and one end of the display panel 120 are disposed at the inside of the first cover unit 150. However, the first cover unit 150 and the back cover 110 may be fixed by various methods but are not limited thereto.

Referring to FIGS. 6 and 7, the second cover unit 160 is disposed in the third support area PA3 of the back cover 110 to accommodate the printed circuit board 140. The printed circuit board 140 and a part of the back cover 110 corresponding to the printed circuit board 140 may be inserted into the second cover unit 160. The second cover unit 160 is disposed to cover the printed circuit board 140 to protect the printed circuit board 140.

The second cover unit 160 includes a second base plate 161, a bottom plate 162, the second cover plate 163, and a plurality of second protrusions 164.

Referring to FIG. 6, the second base plate 161 is disposed on an opposite surface of one surface of the back cover 110. The second base plate 161 may be fixed to the third support area PA3 on the opposite surface of one surface of the back cover 110 on which the display panel 120 is not disposed. The second base plate 161 and the printed circuit board 140 may be disposed so as to correspond to each other with the back cover 110 therebetween. The second base plate 161 may support the printed circuit board 140 together with the third support area PA3. For example, the second base plate 161 is formed of a material having a rigidity to support the third support area PA3 to be flat but is not limited thereto.

The bottom plate 162 is disposed on one surface of the back cover 110. The bottom plate 162 may be disposed to support the printed circuit board 140 disposed on the third support area PA3 of the back cover 110. The bottom plate 162 may be disposed between the printed circuit board 140 and the back cover 110. The bottom plate 162 may have a groove in which the printed circuit board 140 is seated so as not to move. That is, in the bottom plate 162, a portion where the printed circuit board 140 is seated may be concave. The groove may be referred to as a seating unit of the bottom plate 162 in which the printed circuit board 140 is seated.

Therefore, the movement of the printed circuit board 140 disposed on the bottom plate 162 is minimized and the printed circuit board 140 may be stably disposed. However, the bottom plate 162 may be formed to be flat but is not limited thereto.

The second cover plate 163 is disposed on one surface of the back cover 110. The second cover plate 163 may be disposed to cover the printed circuit board 140 and the bottom plate 162 disposed on the third support area PA3 of the back cover 110 and may be formed to have a convex shape. That is, one surface of the second cover plate 163 may be formed as a curved surface. The second cover plate 163 may be fixed to the third support area PA3 and the second base plate 161 on one surface of the back cover 110 on which the display panel 120 and the printed circuit board 140 are disposed. The second cover plate 163 is formed of a material having a rigidity to protect the printed circuit board 140 but is not limited thereto.

Referring to FIG. 7, the plurality of second protrusions 164 which protrudes from the second cover plate 163 toward the first cover plate 152 and is spaced apart from each other is disposed. The plurality of second protrusions 164 extends from the second cover plate 163 toward the first cover plate 152 to be disposed in the second malleable area MA2.

The plurality of first protrusions 153 and the plurality of second protrusions 164 are alternately disposed to be engaged with each other. The plurality of second protrusions 164 may be disposed between the plurality of first protrusions 153 which is spaced apart from each other. The plurality of first protrusions 153 and the plurality of second protrusions 164 are disposed so as to cover some of the at least one flexible film 130 which passes the second malleable area MA2 to protect the at least one flexible film 130.

In the meantime, in FIG. 7, it is illustrated that the plurality of first protrusions 153 and the plurality of second protrusions 164 are alternately disposed so as to be engaged with each other, but are not coupled to each other. However, the plurality of first protrusions 153 and the plurality of second protrusions 164 may be rotatably coupled to each other but are not limited thereto.

In the meantime, the second cover unit 160 and the back cover 110 may be fixed to each other. For example, a plurality of fixing holes is formed in the third support area PA3 and the second cover unit 160 and the back cover 110 may be fixed to each other such that the protrusion protruding from the second base plate 161 is inserted into the fixing hole. For example, the second cover unit 160 and the back cover 110 may be fixed to each other by a member such as a screw which passes through the second base plate 161, the bottom plate 162, the second cover plate 163, and the back cover 110. In this case, the fastening member such as a screw may be disposed so as not to interfere with the printed circuit board 140 to dispose the printed circuit board 140 at the inside of the second cover unit 160. However, the second cover unit 160 and the back cover 110 may be fixed by various methods but are not limited thereto.

The first cover unit 150 and the second cover unit 160 maintain its original state without being bent when the display unit DP is wound to protect the at least one flexible film 130 and the printed circuit board 140. Specifically, when the display unit DP is wound, the first base plate 151 of the first cover unit 150 and the second base plate 161 of the second cover unit 160 having a rigidity are maintained to be flat without being bent to protect the at least one flexible film 130 and the printed circuit board 140. Further, a part of the roller 171 around which the first base plate 151 and the second base plate 161 are wound may be formed to be flat so that the first base plate 151 and the second base plate 161 are not bent. For example, the roller 171 may be configured by a first flat portion 171Fa, a second flat portion 171Fb, and a curved portion 171R and the first base plate 151 and the second base plate 161 are seated on the first flat portion 171Fa and the second flat portion 171Fb, respectively. Therefore, even though the display unit DP is wound, the first base plate 151 and the second base plate 161 may be maintained to be flat without being bent.

Next, when the display unit DP is wound, the first cover plate 152 of the first cover unit 150 and the second cover plate 163 of the second cover unit 160 having a rigidity maintain its original convex shape without being deformed to protect the at least one flexible film 130 and the printed circuit board 140. The first cover plate 152 and the second cover plate 163 having a convex shape may form a circular shape together with the curved portion 171R of the roller 171. Specifically, the first base plate 151 having a flat shape and the first cover plate 152 having a convex shape may form a D shape. The second base plate 161 having a flat shape and the second cover plate 163 having a convex shape may form a D shape. Further, the D-shaped first cover unit 150 is seated on the first flat portion 171Fa of the roller 171 and the D-shaped second cover unit 160 is seated on the second flat portion 171Fb of the roller 171 to form a circular shape together with the curved portion 171R of the roller 171. Accordingly, when the display unit DP is wound around the roller 171, the first cover unit 150, the second cover unit 160, and the roller 171 form one larger circular shape and a part of the display panel 120 which is wound on the first cover unit 150 and the second cover unit 160 may be wound with a larger radius of curvature. Therefore, a stress applied to the display panel 120 may be reduced.

Hereinafter, a process of winding the display unit DP around the roller 171 will be described in detail with reference to FIGS. 8A to 8D.

<Process of Winding Back Cover and Display Panel>

Figure 8A:
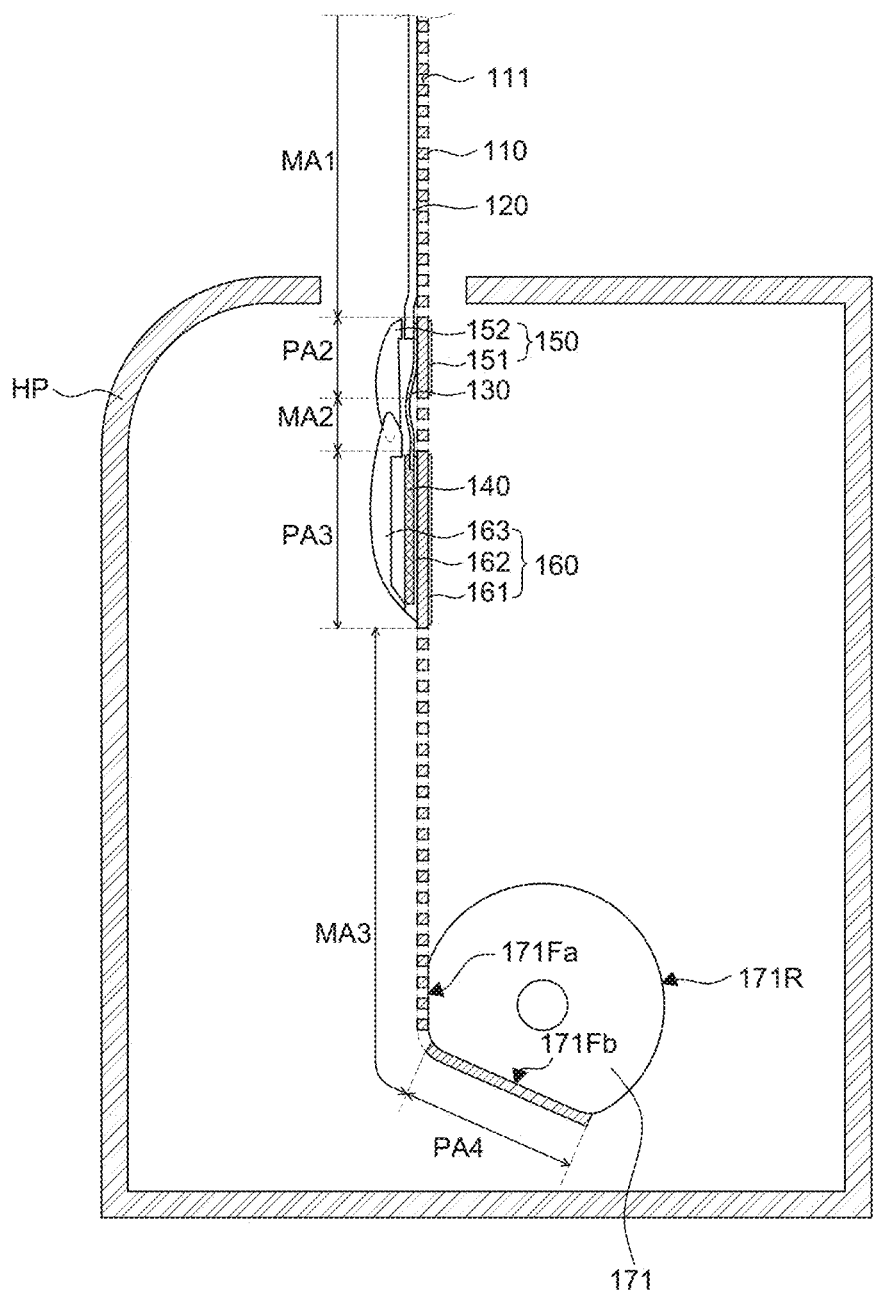
FIGS. 8A to 8D are cross-sectional views of a display device according to an exemplary embodiment of the present disclosure.
Figure 8B:
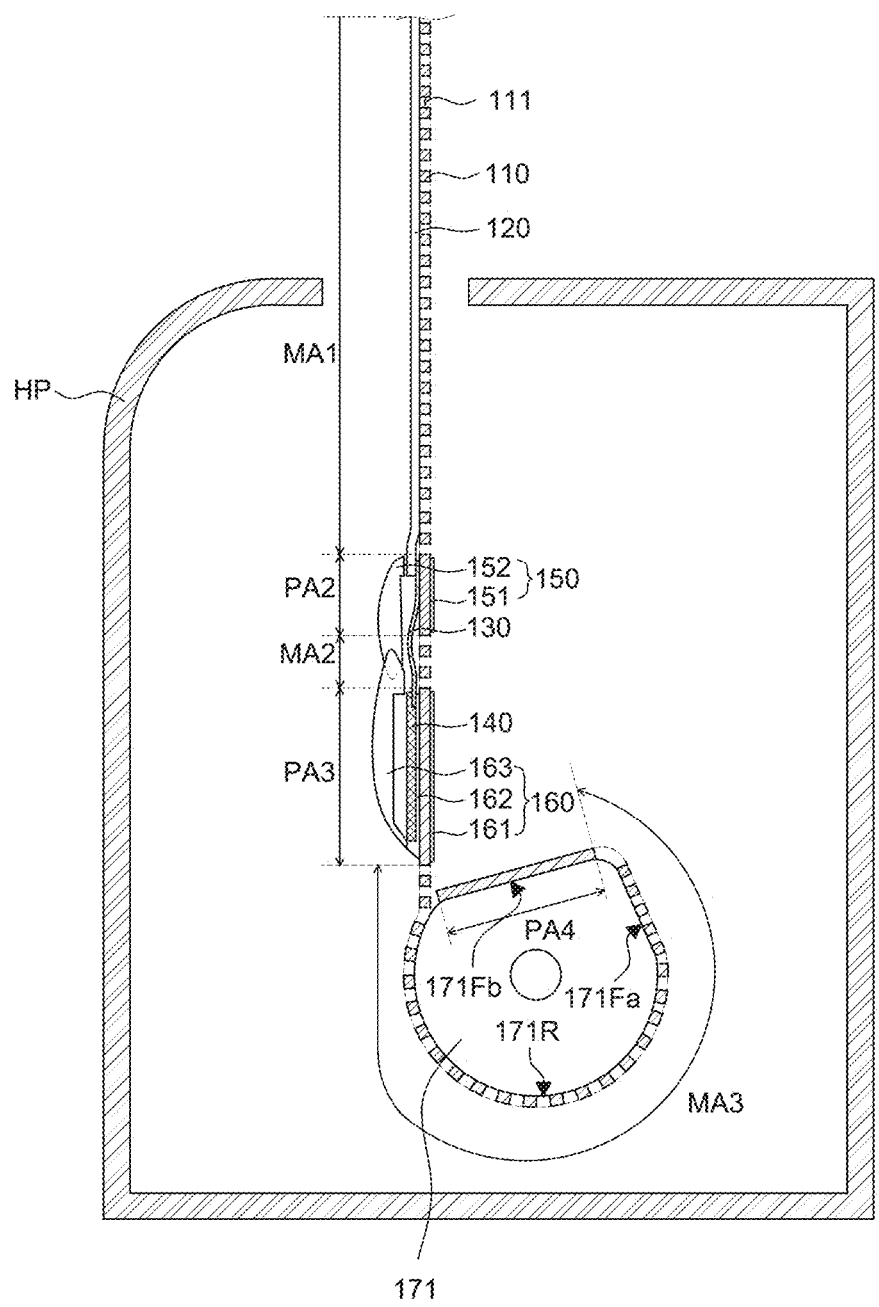
Figure 8C:
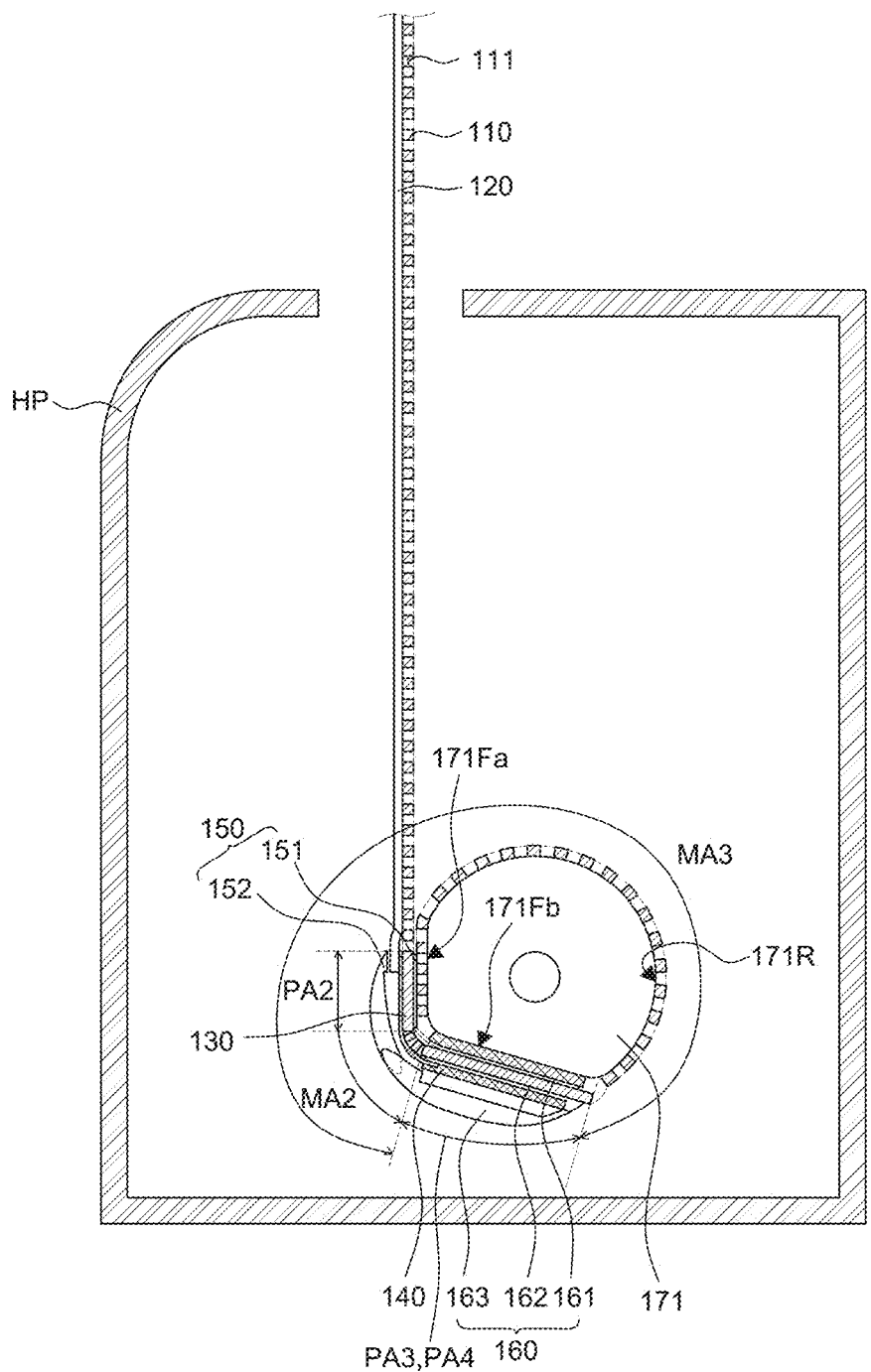
Figure 8D:
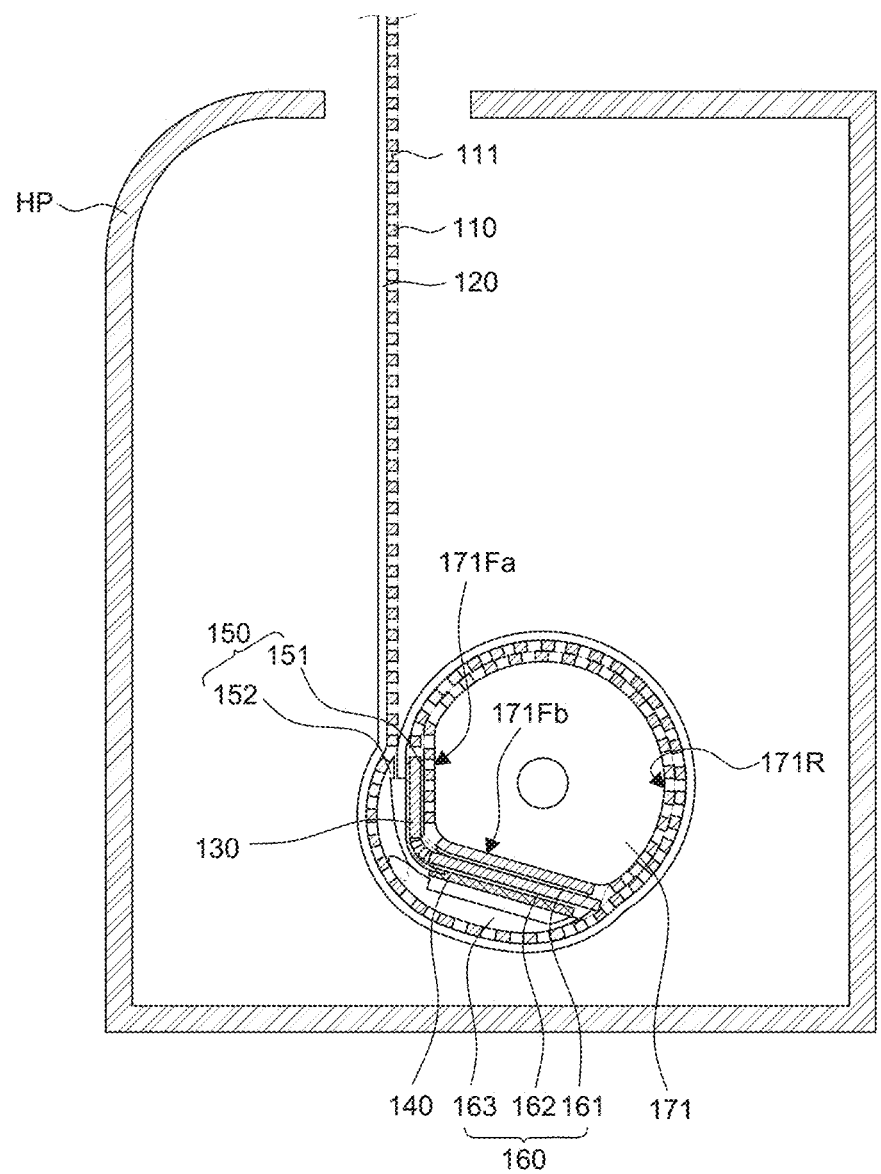

FIGS. 8A to 8D are cross-sectional views of a display device according to an exemplary embodiment of the present disclosure. FIG. 8A is a cross-sectional view in a state in which the back cover 110 is fully unwound from the roller 171. FIG. 8B is a cross-sectional view in a state in which the fourth support area PA4 and the third malleable area MA3 of the back cover 110 are wound around the roller 171. FIG. 8C is a cross-sectional view in a state in which the fourth support area PA4, the third malleable area MA3, the third support area PA3, the second malleable area MA2, and the second support area PA2 of the back cover 110 are wound around the roller 171. FIG. 8D is a cross-sectional view in a state in which the fourth support area PA4, the third malleable area MA3, the third support area PA3, the second malleable area MA2, the second support area PA2, and a part of the first malleable area MA1 of the back cover 110 are wound around the roller 171.

Referring to FIG. 8A, the roller 171 is entirely cylindrical, but a part thereof may be flat. A part of an outer circumferential surface of the roller 171 is configured by a first flat portion 171Fa and a second flat portion 171Fb which are formed to be flat and the remaining part of the outer circumferential surface is configured by a curved portion 171R formed with a curved surface. For example, the second flat portion 171Fb extends from one end of the first flat portion 171Fa and the curved portion 171R may extend from the other end of the first flat portion 171Fa toward the second flat portion 171Fb. In this case, the first flat portion 171Fa is an area where the flexible film 130 is mainly disposed and the second flat portion 171Fb is an area where the printed circuit board 140 is disposed. Therefore, in order to accommodate the printed circuit board 140 having a relatively larger size, a size and an area of the second flat portion 171Fb may be larger than a size and an area of the first flat portion 171Fa. Further, a length between one end of the second flat portion 171Fb and the other end of the second flat portion 171Fb may be larger than a length between one end of the first flat portion 171Fa and the other end of the first flat portion 171Fa.

The fourth support area PA4 of the back cover 110 is fastened with one of the first flat portion 171Fa and the second flat portion 171Fb of the roller 171. For example, the fourth support area PA4 may be fastened with the first flat portion 171Fa of the roller 171 or the fourth support area PA4 may be fastened with the second flat portion 171Fb of the roller 171. Except for the fourth support area PA4 fastened with the roller 171, the remaining portion of the back cover 110 extending from the fourth support area PA4 may be flat. Hereinafter, it is assumed that the fourth support area PA4 of the back cover 110 is fastened with the second flat portion 171Fb but is not limited thereto.

In the meantime, as described above, when the back cover 110 is fully unwound, the fourth support area PA4, the third malleable area MA3, the third support area PA3, the second malleable area MA2, and the second support area PA2 of the back cover 110 may be disposed in the housing unit HP. Further, the first support area PA1 and the first malleable area MA1 may be disposed at the outside of the housing unit HP. Therefore, the display panel 120 is disposed at the outside of the housing unit HP to display the image. The at least one flexible film 130 and the printed circuit board 140 are disposed at the inside of the housing unit HP so as not to be visibly recognized.

Referring to FIG. 8B, the fourth support area PA4 and the third malleable area MA3 are wound around the roller 171. The third support area PA3, the second malleable area MA2, the second support area PA2, the first malleable area MA1, and the first support area PA1 extending from the third malleable area MA3 are unwound from the roller 171.

The fourth support area PA4 is wound on the second flat portion 171Fb of the roller 171 and a part of the third malleable area MA3 is wound on the first flat portion 171Fa, and the remaining part of the third malleable area MA3 is wound on the curved portion 171R.

Next, referring to FIG. 8C, the fourth support area PA4, the third malleable area MA3, the third support area PA3, the second malleable area MA2, and the second support area PA2 are wound around the roller 171. The first malleable area MA1 and the first support area PA1 extending from the second support area PA2 are unwound from the roller 171.

The third support area PA3 is wound on the second flat portion 171Fb on which the fourth support area PA4 is wound. The second support area PA2 is wound on the first flat portion 171Fa on which the third malleable area MA3 is wound. Further, the second malleable area MA2 may be wound at the boundary between the first flat portion 171Fa and the second flat portion 171Fb.

When the second support area PA2 on which the first cover unit 150 is disposed and the third support area PA3 on which the second cover unit 160 is disposed are wound around the roller 171, the curved portion 171R of the roller 171, the first cover unit 150, and the second cover unit 160 may form a circular shape. Specifically, the first cover plate 152 of the first cover unit 150 is formed to have a convex shape and the second cover plate 163 of the second cover unit 160 is also formed to have a convex shape so that the first cover plate 152, the second cover plate 163, and the curved portion 171R may form a circular shape.

The second support area PA2 on which the at least one flexible film 130 and the first cover unit 150 are disposed is wound on the first flat portion 171Fa of the roller 171 so that at least some of the at least one flexible film 130 and the second support area PA2, and the first cover unit 150 may be maintained to be flat.

Further, the third support area PA3 on which the printed circuit board 140 and the second cover unit 160 are disposed is wound on the second flat portion 171Fb of the roller 171 so that the third support area PA3, the second cover unit 160, and the printed circuit board 140 may be maintained to be flat.

Therefore, at least some of the at least one flexible film 130, the printed circuit board 140, the first cover unit 150, and the second cover unit 160 always maintain a flat state regardless of the winding or unwinding of the display unit DP. Accordingly, the damage caused when the at least one flexible film 130 and the printed circuit board 140 are bent may be minimized.

In the meantime, in order to wind the second support area PA2 and the third support area PA3 on the first flat portion 171Fa and the second flat portion 171Fb, respectively, the back cover 110 may be configured to be bent at the boundary between the second support area PA2 and the third support area PA3. The second malleable area MA2 having a plurality of openings 111 is disposed between the second support area PA2 and the third support area PA3 and the second malleable area MA2 may be wound on the boundary between the first flat portion 171Fa and the second flat portion 171Fb.

The second malleable area MA2 of the back cover 110 and some of the at least one flexible film 130 may be wound at the boundary between the first flat portion 171Fa and the second flat portion 171Fb. In this case, since the radius of curvature is small at the boundary between the first flat portion 171Fa and the second flat portion 171Fb, a stress applied to a part of the display unit DP which is wound on the boundary between the first flat portion 171Fa and the second flat portion 171Fb may be large. However, the second malleable area MA2 of the back cover 110 is formed of a material having large rigidity and has a high flexibility so that the damage due to the radius of curvature at the boundary between the first flat portion 171Fa and the second flat portion 171Fb may be minimized.

Further, the at least one flexible film 130 is formed to be longer than the length of the second support area PA2 so as not to be in close contact with the back cover 110 so that the damage at the boundary between the first flat portion 171Fa and the second flat portion 171Fb due to the radius of curvature may be minimized. Specifically, the length of the at least one flexible film 130 may be larger than the length of the second support area PA2. The length of the at least one flexible film 130 may be larger than a distance between an edge of the first malleable area MA1 on which one end of the display panel 120 is disposed and an edge of the third support area PA3 on which one end of the printed circuit board 140 is disposed. As a result, as illustrated in FIG. 8A, in the fully unwound state of the display unit DP, the at least one flexible film 130 may not be in close contact with the second support area PA2. Further, as illustrated in FIG. 8C, even though the display unit DP is wound, the at least one flexible film 130 is not in close contact with the back cover 110 to be bent with a radius of curvature larger than a radius of curvature of the first flat portion 171Fa and the second flat portion 171Fb.

If the length of the at least one flexible film 130 is equal to a length between one end of the display panel 120 and one end of the printed circuit board 140, the at least one flexible film 130 may be in close contact with the back cover 110. Further, when the display unit DP is wound, the at least one flexible film 130 may be bent in accordance with a radius of curvature of the first flat portion 171Fa and the second flat portion 171Fb and a stress applied to some of the at least one flexible film 130 may be increased. Therefore, the length of the at least one flexible film 130 is formed to be larger than the length between one end of the display panel 120 and one end of the printed circuit board 140 so as not to bring the at least one flexible film 130 to be in close contact with the back cover 110 and a stress applied to the at least one flexible film 130 when the display unit DP is wound may be relieved.

Referring to FIG. 8D, the fourth support area PA4, the third malleable area MA3, the third support area PA3, the second malleable area MA2, the second support area PA2, and a part of the first malleable area MA1 are wound around the roller 171 and the remaining part of the first malleable area MA1 and the first support area PA1 are unwound.

The first malleable area MA1 is wound on the second flat portion 171Fb of the roller 171 on which the fourth support area PA4 and the third support area PA3 are wound. The first malleable area MA1 is wound on the first flat portion 171Fa on which the third malleable area MA3 and the second support area PA2 are wound. Further, the first malleable area MA1 is wound on the curved portion 171R on which the third malleable area MA3 is wound.

In the meantime, the first malleable area MA1 may be wound with a circular shape. Specifically, when the first cover unit 150 of the second support area PA2 and the second cover unit 160 of the third support area PA3 are wound on the first flat portion 171Fa and the second flat portion 171Fb of the roller 171, the first cover unit 150 and the second cover unit 160 formed as a D shape may form one circular shape together with the curved portion 171R. Therefore, the first malleable area MA1 wound on the first cover unit 150, the second cover unit 160, and the curved portion 171R and the display panel 120 on the first malleable area MA1 may be wound as a circular shape.

In the meantime, the roller 171 is configured by the first flat portion 171Fa, the second flat portion 171Fb, and the curved portion 171R. Further, a radius of curvature at the boundary between the first flat portion 171Fa and the second flat portion 171Fb may be smaller than the radius of curvature of the curved portion 171R. Similarly, a radius of curvature at the boundary between the first flat portion 171Fa and the curved portion 171R and a radius of curvature at the boundary between the second flat portion 171Fb and the curved portion 171R may be smaller than the radius of curvature of the curved portion 171R. The radius of curvature indicates a degree of bending so that when the radius of curvature is large, it is close to the flat surface. Therefore, a part of the display unit DP which is wound at the boundary between the first flat portion 171Fa and the second flat portion 171Fb, the boundary between the first flat portion 171Fa and the curved portion 171R, and the boundary between the second flat portion 171Fb and the curved portion 171R is bent more than the remaining part of the display unit DP wound on the first flat portion 171Fa, the second flat portion 171Fb, and the curved portion 171R. Therefore, more stress may be applied. When the display unit DP is fully wound, the first malleable area MA1 of the back cover 110 and the display panel 120 may be wound on the first flat portion 171Fa, the second flat portion 171Fb, and the curved portion 171R. Since the back cover 110 is formed of a material having a rigidity, even though a stress is applied, the back cover 110 may not be easily cracked. In contrast, the display panel 120 may be easily cracked due to the stress increased due to the small radius of curvature.

Therefore, in the display device 100 according to the exemplary embodiment of the present disclosure, when the display unit DP is wound with an increased radius of curvature with which the display panel 120 is wound, stress applied to the display panel 120 may be relieved. Specifically, the back cover 110 is wound around the roller 171 from the fourth support area PA4 below the back cover 110 so that the fourth support area PA4, the third malleable area MA3, the third support area PA3, the second malleable area MA2, and the second support area PA2 of the back cover 110 are wound around the roller 171. Thereafter, the first malleable area MA1 of the back cover 110 and the display panel 120 may be wound on the fourth support area PA4, the third malleable area MA3, the third support area PA3, the second malleable area MA2, and the second support area PA2. That is, after the first cover unit 150 and the second cover unit 160 in which the second support area PA2 and the third support area PA3 of the back cover 110 are accommodated, respectively, are wound around the roller 171, the first malleable area MA1 of the back cover 110 and the display panel 120 may be wound on the first cover unit 150 and the second cover unit 160. One surfaces of the first cover plate 152 of the first cover unit 150 and the second cover plate 163 of the second cover unit 160 may be formed as curved surfaces. Therefore, when the first cover unit 150 and the second cover unit 160 are wound around the roller 171, the first cover plate 152, the second cover plate 163, and the curved portion 171R may form a circular shape. Therefore, the display panel 120 is wound on the first cover unit 150, the second cover unit 160, and the curved portion 171R so that when the display unit DP is wound, the stress applied to the display panel 120 may be relieved. That is, the display panel 120 is not bent at the boundary between the first flat portion 171Fa and the second flat portion 171Fb, the boundary between the first flat portion 171Fa and the curved portion 171R, and the boundary between the second flat portion 171Fb and the curved portion 171R with a relatively smaller radius of curvature. However, the display panel 120 is bent on the first cover unit 150, the second cover unit 160, and the curved portion 171R with a relatively large radius of curvature so that the stress applied to the display panel 120 may also be reduced. Therefore, the first cover plate 152 and the second cover plate 163 having a radius of curvature corresponding to the curved portion 171R according to the exemplary embodiment of the present disclosure are disposed so that the display panel 120 may be bent with a relatively larger radius of curvature and the stress applied to the display panel 120 may be reduced.

In the display device 100 according to the exemplary embodiment of the present disclosure, the first cover unit 150 and the second cover unit 160 which accommodate the at least one flexible film 130 and the printed circuit board 140 are disposed. Therefore, the damage of the at least one flexible film 130 and the printed circuit board 140 may be minimized. Specifically, when the display unit DP is wound around the roller 171, the back cover 110 is wound while being bent along the shape of the roller 171. However, when the at least one flexible film 130 and the printed circuit board 140 are bent along the shape of the roller 171, the stress may be applied to the at least one flexible film 130 and the printed circuit board 140. Specifically, the printed circuit board 140 formed of a hard material may be broken. In this case, the second support area PA2 and the third support area PA3 do not have the plurality of openings 111 and are always maintained to be flat to support the at least one flexible film 130 and the printed circuit board 140 disposed on the second support area PA2 and the third support area PA3 to be maintained flat. Here, the first cover unit 150 and the second cover unit 160 formed of a material having a rigidity are disposed to protect the at least one flexible film 130 and the printed circuit board 140. Further, a part of the roller 171 on which the second support area PA2 and the third support area PA3 are wound is formed as the first flat portion 171Fa and the second flat portion 171Fb so that the second support area PA2 and the third support area PA3 may be wound around the roller 171 to be flat. Accordingly, even though the second support area PA2 and the third support area PA3 are wound around the roller 171, a flat state may be maintained and one end of the at least one flexible film 130 connected the display panel 120, the other end of the at least one flexible film 130 connect the printed circuit board 140, and the printed circuit board 140 may also be maintained to be flat. For example, when the display unit DP is fully wound, the at least one flexible film 130 and the printed circuit board 140 are seated on the first flat portion 171Fa and the second flat portion 171Fb of the roller 171 to be maintained flat. Further, the first cover unit 150 and the second cover unit 160 are disposed to cover the at least one flexible film 130 and the printed circuit board 140 so that even though other configuration of the display unit DP is wound on the at least one flexible film 130 and the printed circuit board 140, it does not interfere with the at least one flexible film 130 and the printed circuit board 140. Therefore, in the display device 100 according to the exemplary embodiment of the present disclosure, the at least one flexible film 130 and the first cover unit 150 are disposed in the second support area PA2 and the printed circuit board 140 and the second cover unit 160 are disposed in the third support area PA3. Therefore, one end and the other end of the at least one flexible film 130 and the printed circuit board 140 are maintained to be flat and protected from the external impact. Furthermore, in the display device 100 according to the exemplary embodiment of the present disclosure, the first flat portion 171Fa and the second flat portion 171Fb which are flat are formed on a part of the outer circumferential surface of the roller 171. Therefore, the at least one flexible film 130 and the printed circuit board 140 are not bent and the damage of the at least one flexible film 130 and the printed circuit board 140 may be minimized.

In the display device 100 according to the exemplary embodiment of the present disclosure, one end of the display panel 120 is disposed at the inside of the first cover unit 150 so that the separation of one end of the display panel 120 from the back cover 110 may be minimized. When the display unit DP is repeatedly wound and unwound, the display panel 120 and the back cover 110 may be repeatedly bent. When the display panel 120 and the back cover 110 are repeatedly bent, the adhesiveness of the second adhesive layer AD2 which bonds the display panel 120 with the back cover 110 may be weakened and the display panel 120 and the back cover 110 may be separated. Specifically, the separation is generated at the edge of the display panel 120 to be spread to the entire display panel 120. Therefore, one end of the display panel 120 is disposed in the first cover unit 150 so that the separation of the one end of the display panel 120 from the back cover 110 may be suppressed. The first cover plate 152 is disposed so as to cover one end of the display panel 120 so that the loosening of one end of the display panel 120 from the back cover 110 may be minimized. Therefore, in the display device 100 according to the exemplary embodiment of the present disclosure, the first cover unit 150 which covers one end of the display panel 120 is disposed to minimize the loosening of the edge of the display panel 120 and also minimize the separation between the display panel 120 and the back cover 110.

In the display device 100 according to the exemplary embodiment of the present disclosure, the first flat portion 171Fa and the second flat portion 171Fb of the roller 171 on which the at least one flexible film 130 and the printed circuit board 140 are seated, respectively, are separately formed. Therefore, a design margin of the at least one flexible film 130 and the printed circuit board 140 may be ensured. As compared with a case in which one flat portion on which the at least one flexible film 130 and the printed circuit board 140 are seated is formed on the roller 171, when the first flat portion 171Fa in which the at least one flexible film 130 is seated and the second flat portion 171Fb in which the printed circuit board 140 is seated are respectively formed, a size of an area where the at least one flexible film 130 and the printed circuit board 14 are disposed may be increased.

Hereinafter, an effect of ensuring a design margin of the at least one flexible film 130 and the printed circuit board 140 by separately forming the first flat portion 171Fa and the second flat portion 171Fb will be described with reference to FIG. 9.

<Design Margin of Plurality of Flexible Films and Printed Circuit Board>

Figure 9A:
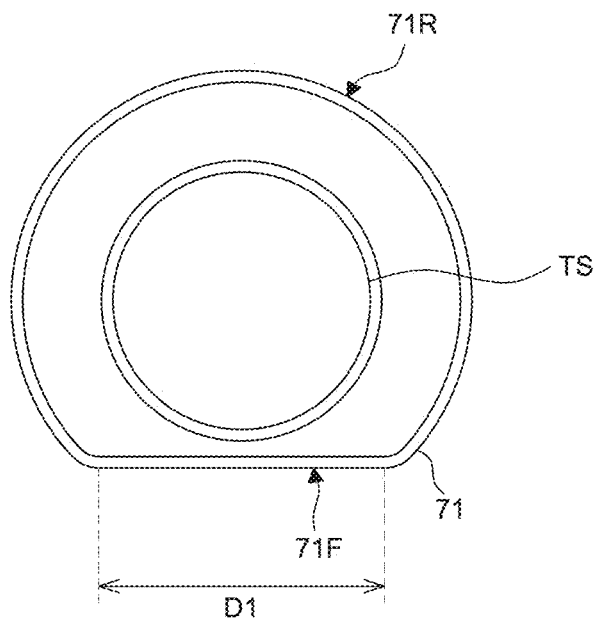
FIGS. 9A and 9B are schematic cross-sectional views of a display device according to a comparative example and an exemplary embodiment of the present disclosure.
Figure 9B:
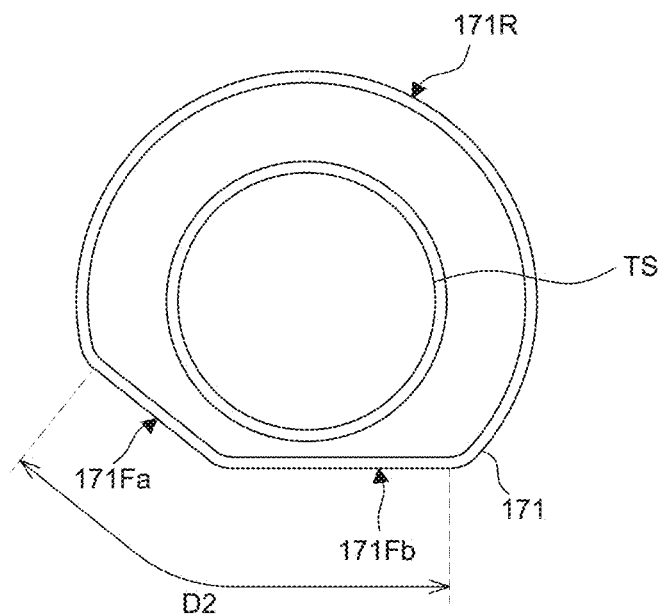

FIGS. 9A and 9B are schematic cross-sectional views of a display device according to a comparative embodiment and an exemplary embodiment of the present disclosure. FIG. 9A is a cross-sectional view of a roller 71 of a display device according to a comparative embodiment. FIG. 9B is a cross-sectional view of a roller 171 of a display device according to an exemplary embodiment. As compared with the roller 171 of the display device 100 according to the exemplary embodiment of the present disclosure, in a roller 71 of the display device according to a comparative embodiment of FIG. 9A, only one flat portion 71F is disposed. The roller 171 of the display device according to the exemplary embodiment of FIG. 9B has the same structure as the roller 171 of the display device 100 according to the exemplary embodiment of the present disclosure.

Referring to FIGS. 9A and 9B, a torsion spring TS may be further disposed in the rollers 71 and 171 to rotate the rollers 71 and 171. The torsion spring TS is disposed in the rollers 71 and 171 to supply additional force to the rollers 71 and 171 when the display unit DP is wound. Further, in the rollers 71 and 171, a predetermined space is necessary to dispose the torsion spring TS.

Referring to FIG. 9A, the roller 71 according to the comparative embodiment is configured by one flat portion 71F and a curved portion 71R. When the display unit DP is wound, the at least one flexible film 130 and the printed circuit board 140 may be seated on the flat portion 71F. In this case, the flat portion 71F may be formed so as not to interfere with the torsion spring TS in the roller 71.

When one flat portion 71F is formed so as not to interfere with the torsion spring TS, a maximum length of the flat portion 71F may be a first length D1. Further, a length from one end of the at least one flexible film 130 to the other end of the printed circuit board 140 may be equal to or smaller than the first length D1. Specifically, when the display unit DP is wound, only if the at least one flexible film 130 and the printed circuit board 140 are seated on the flat portion 71F, the damage of the at least one flexible film 130 and the printed circuit board 140 may be minimized. Therefore, the at least one flexible film 130 and the printed circuit board 140 need to be designed such that a sum of the length of the at least one flexible film 130 and the length of the printed circuit board 140 does not exceed the first length D1.

Referring to FIG. 9B, the roller 171 according to the exemplary embodiment is configured by the first flat portion 171Fa, the second flat portion 171Fb, and the curved portion 171R. When the display unit DP is wound, the at least one flexible film 130 may be seated on the first flat portion 171Fa and the printed circuit board 140 may be seated on the second flat portion 171Fb. Further, the first flat portion 171Fa and the second flat portion 171Fb may be formed so as not to interfere with the torsion spring TS in the roller 171.

Further, when the first flat portion 171Fa and the second flat portion 171Fb are formed so as not to interfere with the torsion spring TS, the entire length of the first flat portion 171Fa and the second flat portion 171Fb may be a second length D2 which is larger than the first length D1. Further, a length from one end of the at least one flexible film 130 to the other end of the printed circuit board 140 may be equal to or smaller than the second length D2. The length of the at least one flexible film 130 may be designed to be equal to or smaller than the length of the first flat portion 171Fa and the length of the printed circuit board 140 may be designed to be equal to or smaller than the length of the second flat portion 171Fb.

In the roller 71 according to the comparative embodiment of FIG. 9A, only one flat portion 71F is formed, and in the roller 171 according to the exemplary embodiment of FIG. 9B, two flat portions which are the first flat portion 171Fa and the second flat portion 171Fb are formed. In this case, in the rollers 71 and 171 of FIGS. 9A and 9B, the flat portion 71F, the first flat portion 171Fa, and the second flat portion 171Fb may be formed so as not to interfere with the torsion spring TS. In order to avoid the interference with the torsion spring TS, it may be difficult for the roller 71 according to the comparative embodiment to extend the length of the flat portion 71F to a predetermined level or more. In contrast, in the roller 171 according to the exemplary embodiment, two flat portions, that is, the first flat portion 171Fa and the second flat portion 171Fb are formed so that as compared with the comparative embodiment, the entire area of the flat portions 171Fa and 171Fb may be increased. Accordingly, as compared with the roller 71 according to the comparative embodiment, in the roller 171 according to the exemplary embodiment, the area in which the at least one flexible film 130 and the printed circuit board 140 may be disposed may be improved.

Further, in the roller 71 according to the comparative embodiment, in order to ensure the area of the flat portion 71F in which the at least one flexible film 130 and the printed circuit board 140 are disposed, the at least one flexible film 130 and the printed circuit board 140 may be designed to reduce the sizes of the at least one flexible film 130 and the printed circuit board 140. Further, the area of the flat portion 71F may be improved by increasing a diameter of the roller 71.

In contrast, in the roller 171 according to the exemplary embodiment, the first flat portion 171Fa and the second flat portion 171Fb are formed to easily ensure the area for disposing the at least one flexible film 130 and the printed circuit board 140. Therefore, in the roller 171 according to the exemplary embodiment, the at least one flexible film 130 and the printed circuit board 140 may be designed to reduce the sizes of the at least one flexible film 130 and the printed circuit board 140. Further, the at least one flexible film 130 and the printed circuit board 140 may be disposed without increasing the diameter of the roller 171.

Accordingly, in the display device 100 according to the exemplary embodiment of the present disclosure, two flat portions, that is, the first flat portion 171Fa and the second flat portion 171Fb are formed to improve the design margin of the at least one flexible film 130 and the printed circuit board 140. As seen from FIGS. 9A and 9B, in the roller 171 according to the exemplary embodiment, two flat portions such as the first flat portion 171Fa and the second flat portion 171Fb are formed to ensure a sufficient space for seating the at least one flexible film 130 and the printed circuit board 140 regardless of the restriction due to the torsion spring TS. Therefore, a redesign process for reducing the size of the at least one flexible film 130 and the printed circuit board 140 may be simplified and the increase of the diameter of the roller 171 is also minimized so that the volume of the fully-wound display device 100 may be minimized. Accordingly, in the display device 100 according to the exemplary embodiment of the present disclosure, the first flat portion 171Fa in which the at least one flexible film 130 is disposed and the second flat portion 171Fb in which the printed circuit board 140 is disposed are separately formed. As a result, a size of an area where the at least one flexible film 130 and the printed circuit board 140 are disposed may be increased and the design margin of the at least one flexible film 130 and the printed circuit board 140 may be ensured.

<Coupling of Back Cover>

Figure 10:
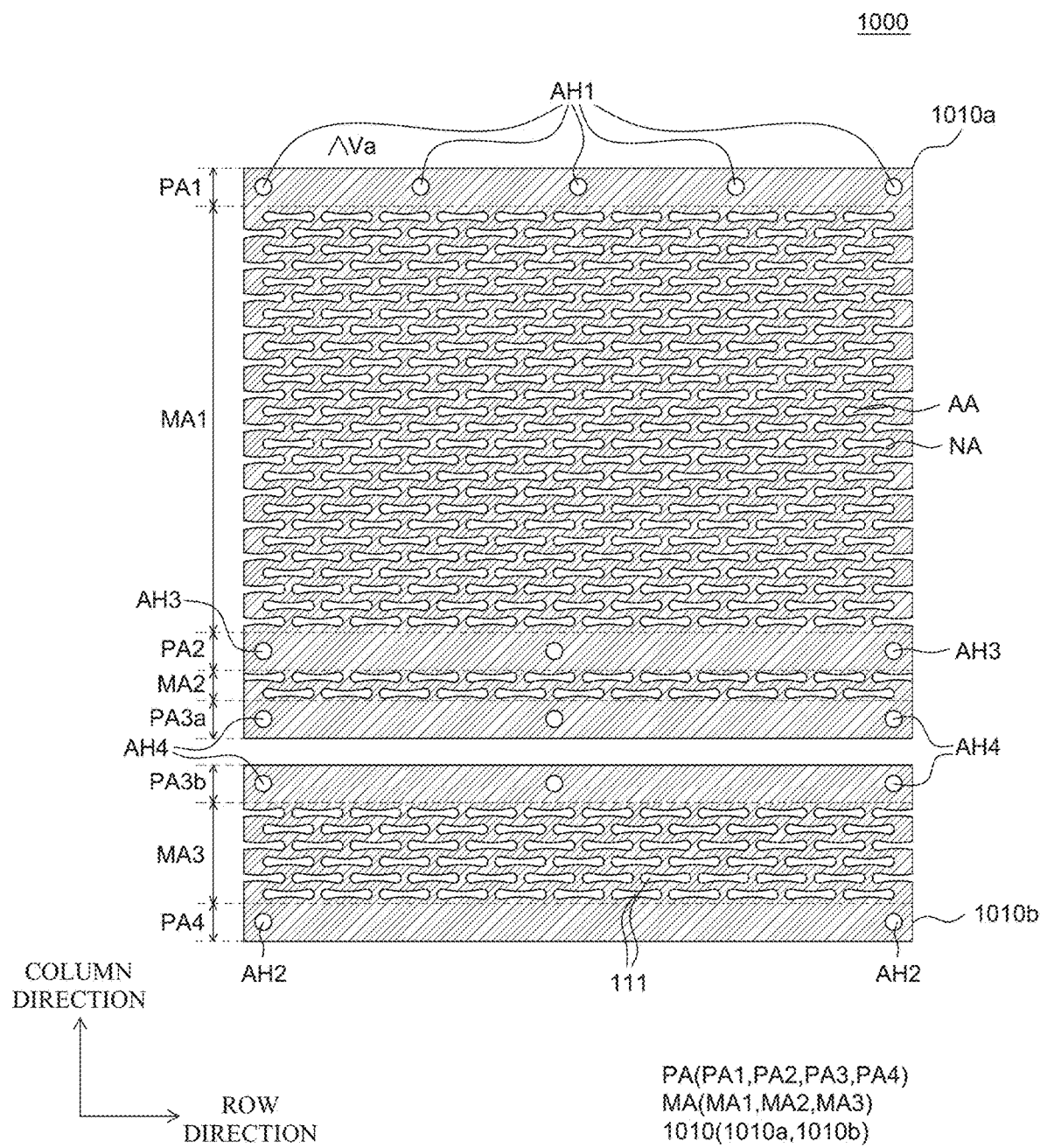
FIG. 10 is a plan view of a back cover of a display device according to another exemplary embodiment of the present disclosure.
Figure 11:
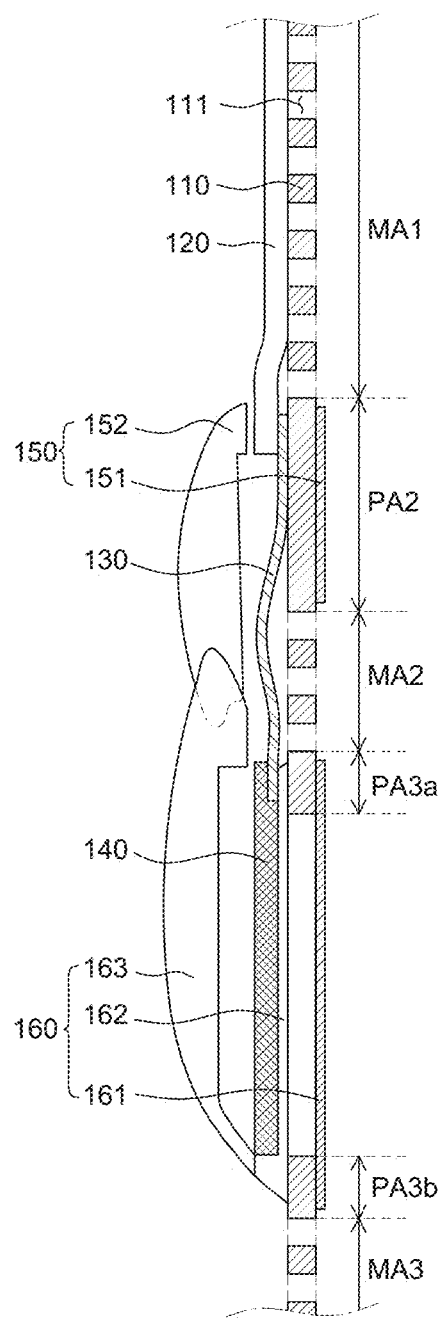
FIG. 11 is a cross-sectional view of a display device according to another exemplary embodiment of the present disclosure.

FIG. 10 is a plan view of a back cover of a display device according to another exemplary embodiment of the present disclosure. FIG. 11 is a cross-sectional view of a display device according to another exemplary embodiment of the present disclosure. The only difference between a display device 1000 of FIGS. 10 and 11 and the display device 100 of FIGS. 1 to 8D is a back cover 1010, but other configuration is substantially the same, so that a redundant description will be omitted. In FIG. 10, for the convenience of description, among various configurations of the display device 1000, only the back cover 1010 is illustrated.

Referring to FIG. 10, the back cover 1010 includes a first back cover 1010a and a second back cover 1010b. The back cover 1010 may be configured to be divided into the first back cover 1010a and the second back cover 1010b. The back cover 1010 may be configured to be divided into the first back cover 1010a and the second back cover 1010b with respect to the third support area PA3. The first back cover 1010a may be fastened with the head bar 182 and the second back cover 1010b may be fastened with the roller 171.

The first back cover 1010a includes a first support area PA1, a first malleable area MA1, a second support area PA2, a second malleable area MA2, and a first fixing area PA3a. Further, the second support area PA2 includes a third fastening hole AH3 and the first fixing area PA3a includes a fourth fastening hole AH4.

The second back cover 1010b includes a second fixing area PA3b, the third malleable area MA3, and the fourth support area PA4. Further, a fourth fastening hole AH4 is formed in the second fixing area PA3b.

The third fastening hole AH3 is a hole which fixes the first base plate 151 and the back cover 1010 to each other. The third fastening hole AH3 may be disposed between the at least one flexible film 130 in the second support area PA2. The first base plate 151 and the back cover 1010 may be fastened with each other by the third fastening hole AH3. Even though in FIG. 10, three third fastening holes AH3 are illustrated, the number of third fastening holes AH3 is illustrative and the number of third fastening holes AH3 may be determined based on the number of the at least one flexible film 130.

The first fixing area PA3a is an area corresponding to an upper portion of the third support area PA3 and is fastened with the second base plate 161 and a bottom plate 162. For example, the upper portions of the second base plate 161 and the bottom plate 162 may be fastened with the first fixing area PA3a.

A second fixing area PA3b is an area corresponding to a lower portion of the third support area PA3 and is fastened with the second base plate 161 and the bottom plate 162. For example, the lower portions of the second base plate 161 and the bottom plate 162 may be fastened with the second fixing area PA3b.

The first fixing area PA3a and the second fixing area PA3b may be connected by the second cover unit 160. For example, the first fixing area PA3a of the first back cover 1010a and the second fixing area PA3b of the second back cover 1010b may be coupled by a plurality of fixing protrusions of the second base plate 161. The fixing protrusion disposed above the second base plate 161 is inserted into a fourth fastening hole AH4 of the first fixing area PA3a and the fixing protrusion disposed below the second base plate 161 is inserted into the fourth fastening hole AH4 of the second fixing area PA3b. By doing this, the second base plate 161, the first back cover 1010a and the second back cover 1010b are coupled. It has been described that the first back cover 1010a and the second back cover 1010b are coupled by inserting the fixing protrusion of the second base plate 161 into the fourth fastening hole AH4. However, the coupling method of the first back cover 1010a, the second back cover 1010b, and the second cover unit 160 is illustrative and is not limited thereto.

In the display device 1000 according to another embodiment of the present disclosure, the back cover 1010 is configured by the first back cover 1010a and the second back cover 1010b which are separated to form the back cover 1010 so as to correspond to various sizes of the display panel 120. As the size of the display device 1000 is gradually increased, the size of the display panel 120 is also increased. In this case, the back cover 1010 needs to be larger than the display panel 120 to protect and support the display panel 120 so that a large size single back cover 1010 needs to be manufactured. However, when the single back cover is manufactured to correspond to the large size display panel 120, there may be a difficulty in the manufacturing process. Therefore, in the display device 1000 according to another embodiment of the present disclosure, the back cover 1010 is configured by the first back cover 1010a and the second back cover 1010b and the first back cover 1010a and the second back cover 1010b may be connected using the second base plate 161 of the second cover unit 160. Accordingly, the first back cover 1010a and the second back cover 1010b may perform all the functions of the back cover 1010 of the related art and the back cover 1010 may be manufactured to be smaller so that the productivity of the back cover 1010 may be improved.

<Rotation Trajectory Guide of First Cover Unit and Second Cover Unit>

Figure 12:
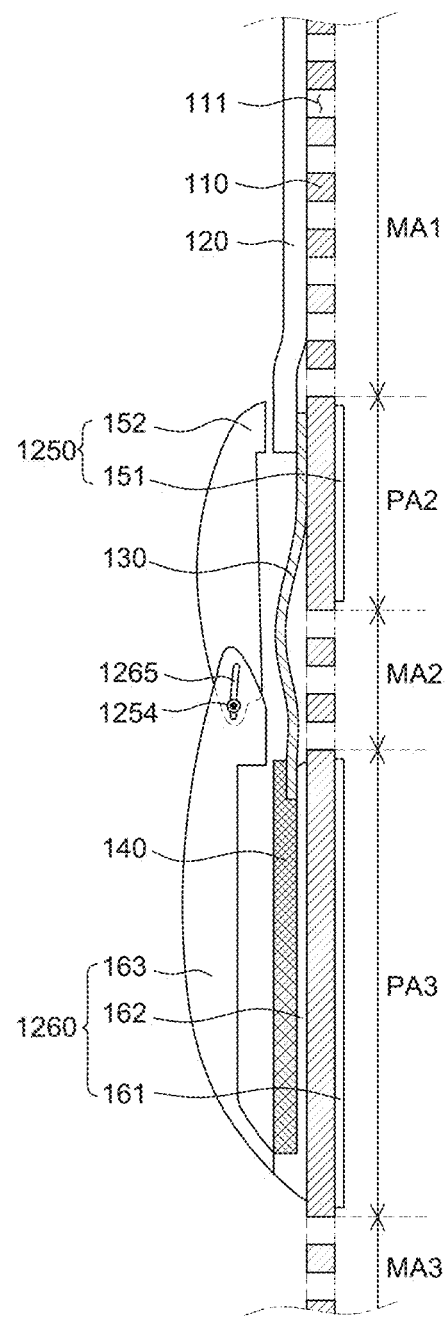
FIG. 12 is a cross-sectional view of a display device according to still another exemplary embodiment of the present disclosure.

FIG. 12 is a cross-sectional view of a display device according to still another exemplary embodiment of the present disclosure. As compared with the display device 100 of FIGS. 1 to 8D, a display device 1200 of FIG. 12 further includes an opening 1265 and a pin 1254, but the other configuration is substantially the same, so that a redundant description will be omitted.

Referring to FIG. 12, pins 1254 which protrude from side surfaces of the plurality of first protrusions 153 are disposed. Each of the plurality of pins 1254 may be disposed on at least one side surface or both side surfaces of the plurality of first protrusions 153. Each of the plurality of pins 1254 may be disposed to be adjacent to edges of the plurality of first protrusions 153. Each of the plurality of pins 1254 may extend from the side surfaces of the plurality of first protrusions 153 toward a side surfaces of the plurality of second protrusions 164 disposed between the plurality of first protrusions 153.

Openings 1265 are disposed in the plurality of second protrusions 164 to pass through the side surfaces of the plurality of second protrusions 164. Further, the pins 1254 protruding from the plurality of first protrusions 153 may be inserted into the openings 1265 of the plurality of second protrusions 164.

The pins 1254 of the plurality of first protrusions 153 are fitted into the openings 1265 of the plurality of second protrusions 164 and the pins 1254 slide along the opening 1265 when the display unit DP is wound or unwound. The pin 1254 may slide along a length direction of the second protrusion 164 in the opening 1265. The pin 1254 may slide in a direction along one surface of the second protrusion 164 in the opening 1265.

For example, when the display unit DP is fully unwound, the pin 1254 from the plurality of first protrusions 153 may be disposed in the opening 1265 to be adjacent to the second cover plate 163. When the display unit DP is fully wound, the first cover plate 152 from which the plurality of first protrusions 153 protrudes and the second cover plate 163 from which the plurality of second protrusions 164 protrudes are seated on the first flat portion 171Fa and the second flat portion 171Fb having different slopes. Therefore, the plurality of first protrusions 153 and the plurality of second protrusions 164 may move so as to be spaced apart from each other. Therefore, when the display unit DP is fully wound, the pin 1254 from the plurality of first protrusions 153 may be disposed in the opening 1265 to be adjacent to the first cover plate 152.

In the meantime, in FIG. 12, it has been described that the pin 1254 protrudes from the plurality of first protrusions 153 and the opening 1265 is formed in the plurality of second protrusions 164. However, the opening 1265 may be formed in the plurality of first protrusions 153 and the pin 1254 may be formed in the plurality of second protrusions 164 and the pin 1254 or the opening 1265 may be formed in some of the first protrusions 153 and some of the second protrusions 164 but is not limited thereto.

In the display device 1200 according to still another exemplary embodiment of the present disclosure, the pin 1254 is formed in the plurality of first protrusions 153 of the first cover unit 1250 and the opening 1265 to which the pin 1254 is inserted is formed in the plurality of second protrusions 164 of the second cover unit 1260. Therefore, the first cover unit 1250 and the second cover unit 1260 may be guided to be wound while forming a gentle curved surface. When the display unit DP is wound, the first cover unit 1250 and the second cover unit 1260 may be seated in the first flat portion 171Fa and the second flat portion 171Fb having different slopes, respectively. The first cover unit 1250 and the second cover unit 1260 are seated in the first flat portion 171Fa and the second flat portion 171Fb, respectively and the second cover plate 163 may rotate from the first cover plate 152. That is, when the display unit DP is wound, the first cover plate 152 and the second cover plate 163 may move along the slopes of the first flat portion 171Fa and the second flat portion 171Fb. In this case, the plurality of first protrusions 153 protruding from the first cover plate 152 and the plurality of second protrusions 164 protruding from the second cover plate 163 may move while rotating. However, the pins 1254 protruding from the plurality of first protrusions 153 are inserted into the openings 1265 of the plurality of second protrusions 164 to slide so that the rotation trajectories of the plurality of first protrusions 153 and the plurality of second protrusions 164 may be guided. Further, the pin 1254 is inserted into the opening 1265 to slide only along the opening 1265. Therefore, the first cover plate 152 and the second cover plate 163 rotate to guide the plurality of first protrusions 153 so as not to excessively protrude to the outside of the plurality of second protrusions 164 and the plurality of second protrusions 164 so as not to excessively protrude to the outside of the plurality of first protrusions 153. Accordingly, the rotation trajectory is guided by the pin 1254 of the plurality of first protrusions 153 of the first cover plate 152 and the opening 1265 of the plurality of second protrusions 164 of the second cover plate 163. Further, when the display unit DP is fully wound, the curved surface formed by the first cover plate 152 and the second cover plate 163 may be formed to be gentle. Therefore, in the display device 1200 according to still another exemplary embodiment of the present disclosure, the pin 1254 is formed in the first cover unit 1250 and the opening 1265 is formed in the second cover unit 1260 to guide the rotation trajectory of the first cover unit 1250 and the second cover unit 1260. Therefore, the first cover unit 1250 and the second cover unit 1260 may form a gentle curved surface.

The exemplary embodiments of the present disclosure can also be described as follows:

According to an aspect of the present disclosure, there is provided a display device. The display device includes a display panel, a back cover which supports the display panel on a rear surface of the display panel, at least one flexible film which is electrically connected to one end of the display panel and is disposed on one surface of the back cover, a printed circuit board which is electrically connected to the at least one flexible film and disposed on one surface of the back cover, and a roller on which the display panel and the back cover are wound or unwound, the roller being configured by a first flat portion, a second flat portion, and a curved portion. When the display panel and the back cover are fully wound around the roller, the at least one flexible film is disposed so as to correspond to the first flat portion and the printed circuit board is disposed so as to correspond to the second flat portion.

The display device may further include a first cover unit which accommodates the at least one flexible film, and a second cover unit which accommodates the printed circuit board.

The first cover unit may include a first base plate which is fixed to the back cover on an opposite surface of one surface of the back cover, and a first cover plate which covers the at least one flexible film on one surface of the back cover. The second cover unit may include a second base plate which is fixed to the back cover on an opposite surface of one surface of the back cover, and a second cover plate which covers the printed circuit board on one surface of the back cover. One surfaces of the first cover plate and the second cover plate may be formed as curved surfaces.

One end of the display panel may be disposed in the first cover unit.

The second cover unit may further include a bottom plate disposed between the printed circuit board and the back cover.

The bottom plate may include a groove-shaped seating unit in which the printed circuit board is seated.

The first cover unit may further include a plurality of first protrusions which protrudes from the first cover plate toward the second cover plate and is spaced apart from each other. The second cover unit may further include a plurality of second protrusions which protrudes from the second cover plate toward the first cover plate and is spaced apart from each other. The plurality of first protrusions and the plurality of second protrusions may be alternately disposed so as to be engaged with each other.

The display device may further include an opening which passes through a side surface of any one of the plurality of first protrusions or the plurality of second protrusions, and a pin which extends from a side surface of any one of the plurality of first protrusions or the plurality of second protrusions toward the inside of the opening.

The pin may be configured so as to slide along a length direction of the plurality of first protrusions or the plurality of second protrusions in the opening.

When the display panel and the back cover are fully wound around the roller, the first cover unit, the second cover unit, and the roller may form a circular shape.

The back cover may include a first back cover on which the display panel, the at least one flexible film, and the first cover unit are disposed, and a second back cover which is spaced apart from the first back cover and has one end fixed to the roller. One end of the second cover unit may be connected to the first back cover and the other end of the second cover unit is connected to the second back cover.

The second flat portion may extend from one end of the first flat portion and the curved portion extends from the other end of the first flat portion toward the second flat portion.

The back cover may include a plurality of openings disposed in a portion corresponding to at least a part of the display panel and a portion corresponding to a boundary between the first flat portion and the second flat portion.

A size of the second flat portion may be larger than a size of the first flat portion.

According to another aspect of the present disclosure, there is provided a display device. The display device includes a display panel, at least one flexible film which is electrically connected to the display panel, a printed circuit board which is electrically connected to the at least one flexible film, a back cover which supports the display panel, the at least one flexible film, and the printed circuit board and includes a plurality of openings, a first cover unit into which the at least one flexible film, a part of the back cover corresponding to the at least one flexible film, and a part of the display panel corresponding to the at least one flexible film are inserted, a second cover unit into which the printed circuit board and another part of the back cover corresponding to the printed circuit board are inserted, and a roller on which the display panel and the back cover are wound or unwound, the roller including a first flat portion corresponding to the first cover unit and a second flat portion corresponding to the second cover unit and extending from the first flat portion.

The roller may further include a curved portion extending from the second flat portion to the first flat portion. The first cover unit and the second cover unit may be formed as a D shape so that when the display panel and the back cover are fully wound, the first cover unit, the second cover unit, and the curved portion of the roller may form a circular shape.

The first cover unit may further include a first cover plate which covers the at least one flexible film, and a plurality of first protrusions which protrudes from the first cover plate toward the second cover unit. The second cover unit may further include a second cover plate which covers the printed circuit board, and a plurality of second protrusions which protrudes from the second cover plate toward the first cover unit. The plurality of first protrusions and the plurality of second protrusions may be alternately disposed.

The display device may further include a pin which passes through side surfaces of the plurality of first protrusions and the plurality of second protrusions. The first cover unit may further include a first opening which is disposed on a side surface of each of the plurality of first protrusions to allow the pin to pass therethrough. The second cover unit may further include a second opening which is disposed on a side surface of each of the plurality of second protrusions to allow the pin to pass therethrough. At least a part of the first opening and at least a part of the second opening may be configured to communicate with each other.

The plurality of openings of the back cover may be disposed in a portion overlapping at least a part of the display panel, a portion overlapping a boundary between the first flat portion and the curved portion, a portion overlapping a boundary between the second flat portion and the curved portion, and a portion overlapping a boundary between the first flat portion and the second flat portion.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a display panel;
    a back cover which supports the display panel on a rear surface of the display panel;
    at least one flexible film which is electrically connected to one end of the display panel and is disposed on one surface of the back cover;
    a printed circuit board which is electrically connected to the at least one flexible film and disposed on one surface of the back cover; and
    a roller on which the display panel and the back cover are wound or unwound, the roller being configured by a first flat portion, a second flat portion, and a curved portion,
    wherein when the display panel and the back cover are fully wound around the roller, the at least one flexible film is disposed so as to correspond to the first flat portion and the printed circuit board is disposed so as to correspond to the second flat portion.

2. The display device according to claim 1, further comprising:
    a first cover unit which accommodates the at least one flexible film; and
    a second cover unit which accommodates the printed circuit board.

3. The display device according to claim 2, wherein the first cover unit includes:
    a first base plate which is fixed to the back cover on an opposite surface of one surface of the back cover; and
    a first cover plate which covers the at least one flexible film on one surface of the back cover,
    the second cover unit includes:
    a second base plate which is fixed to the back cover on an opposite surface of one surface of the back cover; and
    a second cover plate which covers the printed circuit board on one surface of the back cover, and
    one surfaces of the first cover plate and the second cover plate are formed as curved surfaces.

4. The display device according to claim 3, wherein one end of the display panel is disposed in the first cover unit.

5. The display device according to claim 3, wherein the second cover unit further includes a bottom plate disposed between the printed circuit board and the back cover.

6. The display device according to claim 5, wherein the bottom plate includes a groove-shaped seating unit in which the printed circuit board is seated.

7. The display device according to claim 3, wherein the first cover unit further includes a plurality of first protrusions which protrudes from the first cover plate toward the second cover plate and is spaced apart from each other,
    the second cover unit further includes a plurality of second protrusions which protrudes from the second cover plate toward the first cover plate and is spaced apart from each other, and
    the plurality of first protrusions and the plurality of second protrusions are alternately disposed so as to be engaged with each other.

8. The display device according to claim 7, further comprising:
    an opening which passes through a side surface of any one of the plurality of first protrusions or the plurality of second protrusions; and
    a pin which extends from a side surface of any one of the plurality of first protrusions or the plurality of second protrusions toward the inside of the opening.

9. The display device according to claim 8, wherein the pin is configured so as to slide along a length direction of the plurality of first protrusions or the plurality of second protrusions in the opening.

10. The display device according to claim 2, wherein when the display panel and the back cover are fully wound around the roller, the first cover unit, the second cover unit, and the roller form a circular shape.

11. The display device according to claim 2, wherein the back cover includes:
    a first back cover on which the display panel, the at least one flexible film, and the first cover unit are disposed; and
    a second back cover which is spaced apart from the first back cover and has one end fixed to the roller, and
    one end of the second cover unit is connected to the first back cover and the other end of the second cover unit is connected to the second back cover.

12. The display device according to claim 1, wherein the second flat portion extends from one end of the first flat portion and the curved portion extends from the other end of the first flat portion toward the second flat portion.

13. The display device according to claim 1, wherein the back cover includes a plurality of openings disposed in a portion corresponding to at least a part of the display panel and a portion corresponding to a boundary between the first flat portion and the second flat portion.

14. The display device according to claim 1, wherein a size of the second flat portion is larger than a size of the first flat portion.

15. A display device, comprising:
    a display panel;
    at least one flexible film which is electrically connected to the display panel;
    a printed circuit board which is electrically connected to the at least one flexible film;

a back cover which supports the display panel, the at least one flexible film, and the printed circuit board and includes a plurality of openings;

a first cover unit into which the at least one flexible film, a part of the back cover corresponding to the at least one flexible film, and a part of the display panel corresponding to the at least one flexible film are inserted;

a second cover unit into which the printed circuit board and another part of the back cover corresponding to the printed circuit board are inserted; and a roller on which the display panel and the back cover are wound or unwound, the roller including a first flat portion corresponding to the first cover unit and a second flat portion corresponding to the second cover unit and extending from the first flat portion.

16. The display device according to claim 15, wherein the roller further includes a curved portion extending from the second flat portion to the first flat portion, and the first cover unit and the second cover unit are formed as a D shape so that when the display panel and the back cover are fully wound, the first cover unit, the second cover unit, and the curved portion of the roller form a circular shape.

17. The display device according to claim 16, wherein the plurality of openings of the back cover is disposed in a portion overlapping at least a part of the display panel, a portion overlapping a boundary between the first flat portion and the curved portion, a portion overlapping a boundary between the second flat portion and the curved portion, and a portion overlapping a boundary between the first flat portion and the second flat portion.

18. The display device according to claim 15, wherein the first cover unit further includes:

a first cover plate which covers the at least one flexible film; and a plurality of first protrusions which protrudes from the first cover plate toward the second cover unit, the second cover unit further includes:

a second cover plate which covers the printed circuit board; and a plurality of second protrusions which protrudes from the second cover plate toward the first cover unit, and the plurality of first protrusions and the plurality of second protrusions are alternately disposed.

19. The display device according to claim 18, further comprising:

a pin which passes through side surfaces of the plurality of first protrusions and the plurality of second protrusions, wherein the first cover unit further includes a first opening which is disposed on a side surface of each of the plurality of first protrusions to allow the pin to pass therethrough, the second cover unit further includes a second opening which is disposed on a side surface of each of the plurality of second protrusions to allow the pin to pass therethrough, and at least a part of the first opening and at least a part of the second opening are configured to communicate with each other.

* * * * *